United States Patent
Yamazoe

(10) Patent No.: US 7,657,865 B2
(45) Date of Patent: Feb. 2, 2010

(54) COMPUTER-READABLE RECORDING MEDIUM RECORDING A MASK DATA GENERATION PROGRAM, MASK DATA GENERATION METHOD, MASK FABRICATION METHOD, EXPOSURE METHOD, AND DEVICE MANUFACTURING METHOD

(75) Inventor: Kenji Yamazoe, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 278 days.

(21) Appl. No.: 11/855,722

(22) Filed: Sep. 14, 2007

(65) Prior Publication Data

US 2008/0068393 A1 Mar. 20, 2008

(30) Foreign Application Priority Data

Sep. 20, 2006 (JP) ............................. 2006-254981

(51) Int. Cl.
*G06F 17/50* (2006.01)
(52) U.S. Cl. .......................................... 716/21; 716/19
(58) Field of Classification Search ....................... None
See application file for complete search history.

(56) References Cited

U.S. PATENT DOCUMENTS

| | | | | |
|---|---|---|---|---|
| 5,357,311 | A | 10/1994 | Shiraishi | 355/53 |
| 7,100,145 | B2 * | 8/2006 | Shi et al. | 716/19 |
| 7,107,573 | B2 * | 9/2006 | Yamazoe et al. | 716/21 |
| 7,231,629 | B2 * | 6/2007 | Laidig | 716/21 |

(Continued)

FOREIGN PATENT DOCUMENTS

EP 1 237 046 A2 9/2002

(Continued)

OTHER PUBLICATIONS

Extended European Search Report (including European search opinion) dated Feb. 5, 2008, mailed in a Communication dated Feb. 11, 2008, in copending European patent application No. 07 01 8089, 6 pages.

(Continued)

*Primary Examiner*—Leigh Marie Garbowski
(74) *Attorney, Agent, or Firm*—Fitzpatrick, Cella, Harper & Scinto

(57) ABSTRACT

A computer-readable recording medium recording a mask data generation program, which causes a computer to generate data of a mask illuminated by illumination light and used to form a latent image on a photoresist via a projection optical system. The program causes the computer to execute a map generation step of Fourier-transforming a function indicating an effective light source to generate a coherence map expressing a coherence distribution on an object plane of the projection optical system, on which the mask is arranged, a specifying step of specifying a reference vector from an origin of the coherence map to a region where coherence is less than a reference value, a first data generation step of selecting one element from a pattern including a plurality of elements, and removing, from the pattern, an element existing at a position matching a terminal point of the reference vector arranged such that the center of the selected element serves as a starting point, to generate data of a first pattern different from the pattern, and a second data generation step of generating data of a second pattern including the element removed in generating the data of the first pattern.

8 Claims, 30 Drawing Sheets

U.S. PATENT DOCUMENTS

| | | | |
|---|---|---|---|
| 7,506,299 B2 * | 3/2009 | Socha et al. | 716/19 |
| 2004/0229133 A1 | 11/2004 | Socha et al. | 430/5 |
| 2005/0142470 A1 | 6/2005 | Socha et al. | 430/30 |
| 2005/0149900 A1 | 7/2005 | Laidig | 716/19 |
| 2007/0168898 A1 * | 7/2007 | Gupta et al. | 716/9 |
| 2008/0070131 A1 * | 3/2008 | Yamazoe | 430/5 |

FOREIGN PATENT DOCUMENTS

| | | |
|---|---|---|
| EP | 1 239 331 A2 | 9/2002 |
| EP | 1439420 A1 | 7/2004 |
| EP | 1544680 A2 | 6/2005 |
| JP | 2004-221594 A | 8/2004 |
| JP | 2005-183981 A | 7/2005 |
| WO | WO 01/61412 A1 | 8/2001 |

OTHER PUBLICATIONS

Robert Socha, et al. "Simultaneous Source Mask Optimization (SMO)," Proceedings of SPIE, vol. 5853 (2005), pp. 180-193.

* cited by examiner

F I G. 15
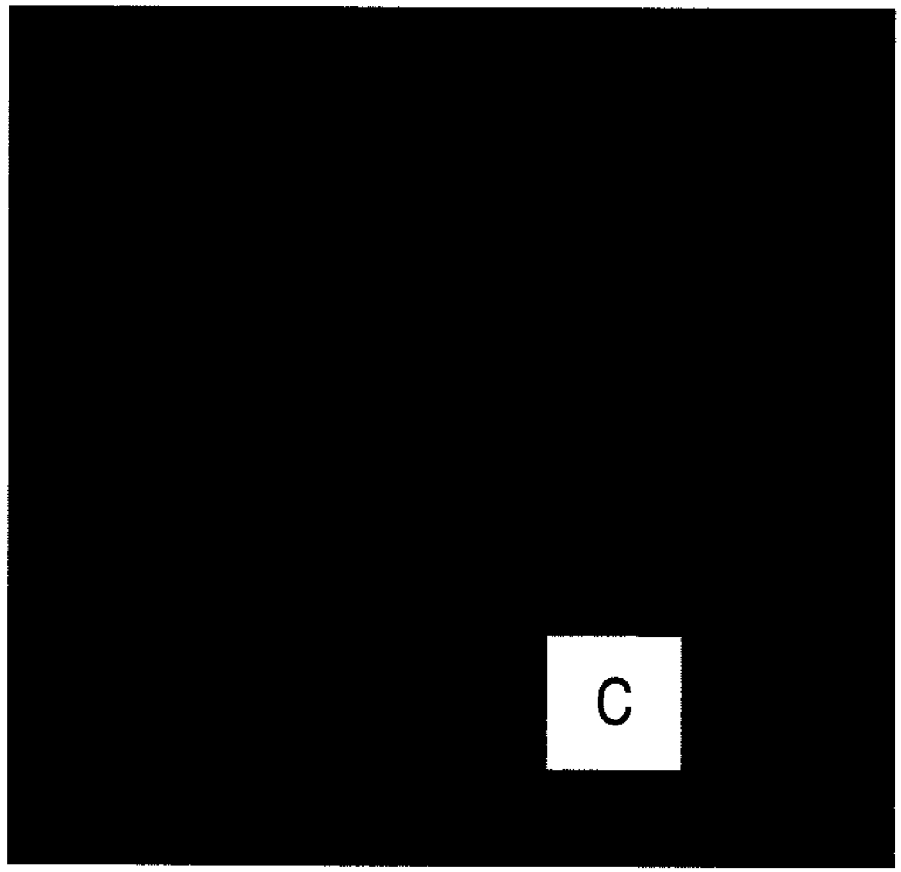

F I G. 18
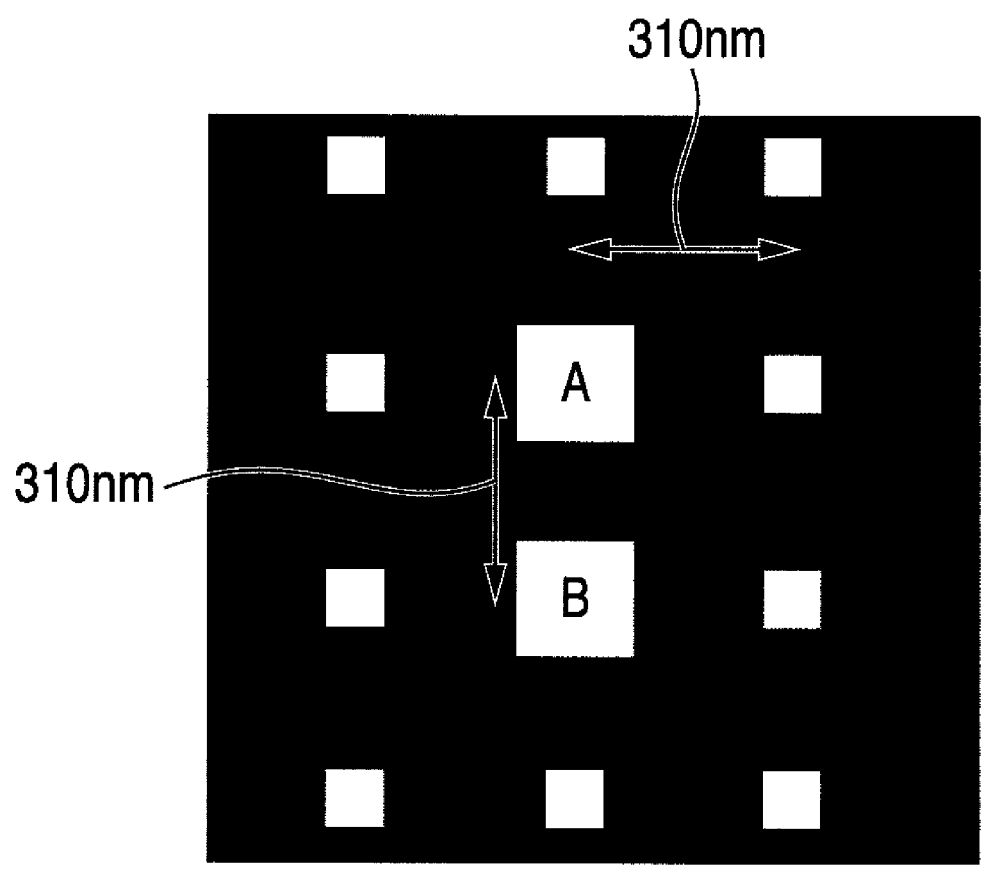

F I G. 20
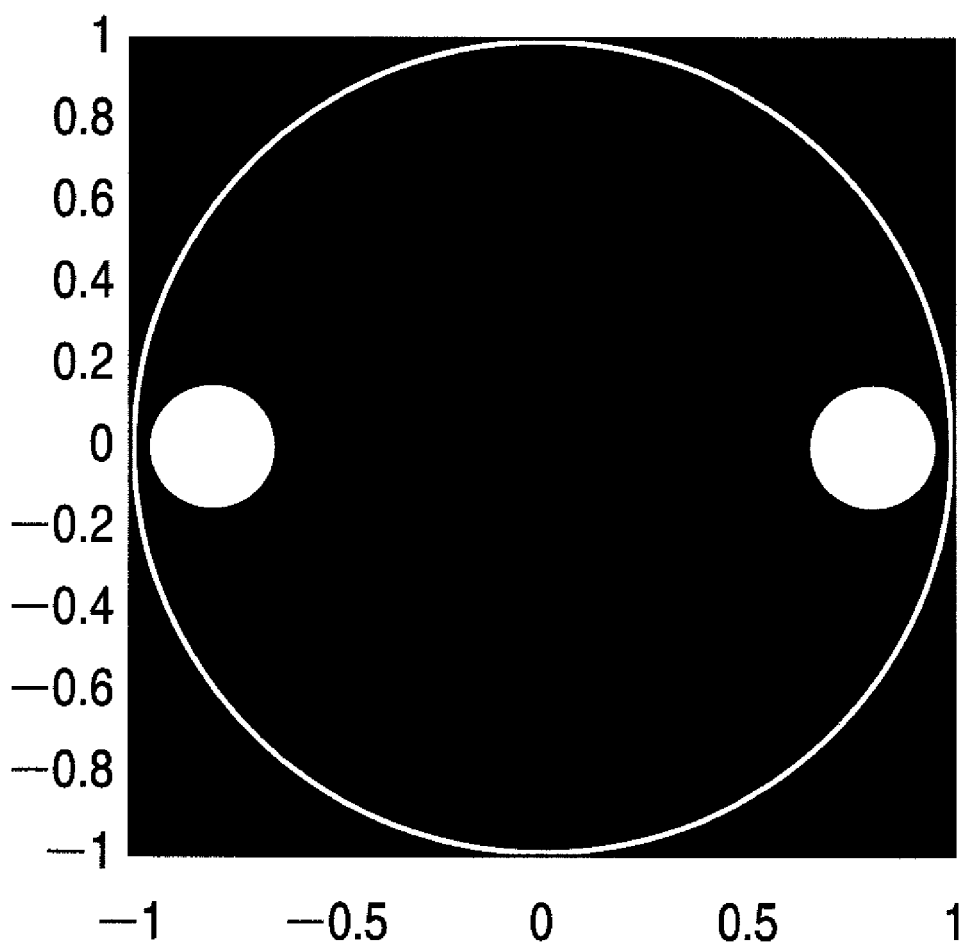

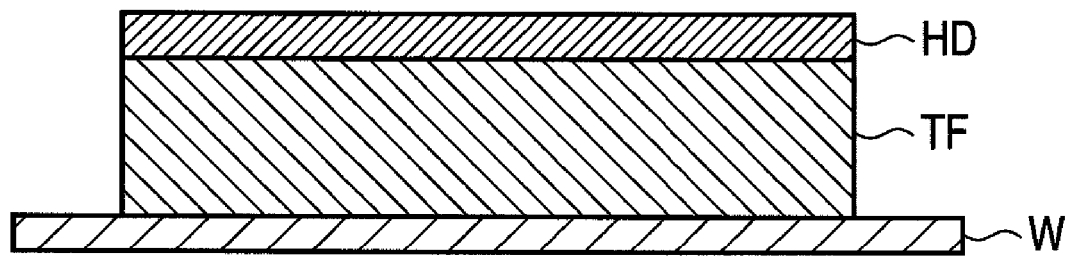
F I G. 26

COMPUTER-READABLE RECORDING MEDIUM RECORDING A MASK DATA GENERATION PROGRAM, MASK DATA GENERATION METHOD, MASK FABRICATION METHOD, EXPOSURE METHOD, AND DEVICE MANUFACTURING METHOD

This application claims the benefit of Japanese Patent Application No. 2006-254981, filed Sep. 20, 2006, which is hereby incorporated by reference herein in its entirety.

BACKGROUND OF THE INVENTION

1. Field of the Invention

The present invention relates to a computer-readable recording medium recording a mask data generation program, a mask data generation method, a mask fabrication method, an exposure method, and a device manufacturing method.

2. Description of the Related Art

There has conventionally been used a projection exposure apparatus, which uses a projection optical system to transfer the circuit pattern drawn on a mask (reticle) onto a substrate (e.g., a wafer). Under the circumstances, a demand for a high-resolution exposure apparatus is increasing. Known high-resolution exposure methods increase the numerical aperture (NA) of a projection optical system, shorten the exposure wavelength ($\lambda$), or decrease the k1 factor.

Multiple exposure is one of the micropattern exposure techniques. Multiple exposure includes a method of superimposing latent image patterns after each of a plurality of exposure processes, without executing a development process between them, and a method of executing a development process after each of a plurality of exposure processes. A representative example of the former method is double exposure, in which a dense pattern is divided into two sparse patterns. In another double exposure, a line pattern is divided in vertical and horizontal directions, and the divided patterns are separately transferred by exposure to form a desired line pattern. In the latter method, latent image patterns are superimposed by executing the development process after each exposure process. These methods are one approach to decreasing the k1 factor.

"Proceedings of SPIE Vol. 5853 (2005)", on page 180, describes how to divide a plurality of elements of a layout pattern. That is, an interference map is calculated to obtain a forbidden pitch on the basis of this map. Then, among the plurality of elements of the layout pattern, an element, which is positioned at a forbidden pitch, is extracted from the plurality of elements and set as another mask pattern. Among the remaining plurality of elements, an element, which is positioned at a forbidden pitch, is extracted from the remaining plurality of elements and set as still another mask pattern as well. Repeating such procedures makes it possible to divide the plurality of elements of the layout pattern so that they become free from any forbidden pitches.

Japanese Patent Laid Open Nos. 2004-221594 and 2005-183981 describe techniques of obtaining an approximate distribution of imaging plane amplitude by numerical calculation to derive an interference map. That is, the interference map expresses an approximate distribution of imaging plane amplitude.

More specifically, a transmission cross coefficient (to be referred to as a TCC hereafter) is derived. An aerial image undergoes decomposition (singular value decomposition; SVD) into N images (called eigenfunctions, N: a Natural number) on the basis of the TCC result. This method is called a sum of coherent system decomposition (to be referred to as SOCS hereafter).

The N eigenfunctions decomposited by SOCS each have a positive or a negative value. An eigenvalue ($i^{th}$ eigenvalue) corresponding to the $i^{th}$ eigenfunction is multiplied by a function obtained by squaring the absolute value of the $i^{th}$ eigenfunction to obtain N functions. The N functions are added to obtain an aerial image.

Assuming that a largest eigenvalue is the first eigenvalue and its corresponding eigenfunction is the first eigenfunction, the first eigenfunction contributes most to forming an aerial image. In view of this, the aerial image is approximated by the first eigenfunction. This approximation allows the derivation of an imaging plane amplitude distribution. That is, an interference map can be calculated.

An auxiliary pattern is inserted in a portion having a positive value in the interference map, such that exposure light transmitted through the contact hole pattern is in phase with that transmitted through the auxiliary pattern. An auxiliary pattern is inserted in a portion having a negative value in the interference map, such that the phase difference between exposure light transmitted through the contact hole pattern and that transmitted through the auxiliary pattern is 180°.

Unfortunately, the techniques described in Japanese Patent Laid-Open Nos. 2004-221594 and 2005-183981 require the calculation of a TCC and eigenfunction to derive an interference map. This often complicates the whole numerical calculation, to result in a long mask data generation time.

In the technique described in "Proceedings of SPIE Vol. 5853 (2005)", on page 180, mask data for multiple exposure is generated using the interference map. Likewise, this often results in a long mask data generation time.

SUMMARY OF THE INVENTION

The present invention provides a computer-readable recording medium recording a mask data generation program, and a mask data generation method, which can shorten the time taken to generate mask data used in multiple exposure.

According to a first aspect, the present invention provides a computer-readable recording medium recording a mask data generation program, which causes a computer to generate data of a mask illuminated by illumination light and used to form a latent image on a photoresist via a projection optical system, the program characterized by causing the computer to execute a map generation step of Fourier-transforming a function indicating an effective light source to generate a coherent map expressing a coherence distribution on an object plane of the projection optical system, on which the mask is arranged, a specifying step of specifying a reference vector from an origin of the coherent map to a region where a coherence is less than a reference value, a first data generation step of selecting one element from a pattern including a plurality of elements, and removing, from the pattern, an element existing at a position matching a terminal point of the reference vector arranged such that the center of the selected element serves as a starting point, to generate data of a first pattern different from the pattern, and a second data generation step of generating data of a second pattern including the element removed in generating the data of the first pattern.

According to a second aspect, the present invention provides a mask data generation method of generating data of a mask illuminated by illumination light and used to form a latent image on a photoresist via a projection optical system, the method comprising a map generation step of Fourier-transforming a function indicating an effective light source to generate a coherent map expressing a coherence distribution on an object plane of the projection optical system, on which the mask is arranged, a specifying step of specifying a reference vector from an origin of the coherent map to a region where a coherence is less than a reference value, a first data generation step of selecting one element from a pattern including a plurality of elements, and removing, from the pattern, an element existing at a position matching a terminal point of the reference vector arranged such that the center of the selected element serves as a starting point, to generate data of a first pattern different from the pattern, and a second data generation step of generating data of a second pattern including the element removed in generating the data of the first pattern.

According to the present invention, it is possible to shorten the time taken to generate mask data used in multiple exposure.

Further features of the present invention will become apparent from the following description of exemplary embodiments, with reference to the attached drawings.

BRIEF DESCRIPTION OF THE DRAWINGS

FIG. 15 is a view showing still another pattern data according to the first working example of the present invention;

FIG. 18 is a view showing mask data according to the first working example of the present invention;

FIG. 20 is a view showing an effective light source according to the second working example of the present invention;

FIG. 26 is a view for explaining a method of executing a development process after each of a plurality of exposure processes;

DESCRIPTION OF THE EMBODIMENTS

The present invention is applicable especially in generating mask data used for micromechanics or various devices, for example, a semiconductor chip, such as an IC or an LSI, a display element, such as a liquid crystal panel, a detection element, such as a magnetic head, and an image sensing element, such as a CCD. The micromechanics here refer to a sophisticated micron-order machinery system or a technique of building this system, which are attained by applying a semiconductor integrated circuit manufacturing technology to the manufacture of a microstructure. The present invention is suitable for so-called immersion exposure for bringing the final surface of a projection optical system and the surface of a wafer into contact with a liquid, and forming a latent image on a photoresist via the projection optical system and liquid.

The present invention discloses a concept which can be mathematically modeled. It is, therefore, possible to implement this concept as a software function of a computer system. The software function of the computer system includes programming executable software codes and enables an auxiliary pattern to be inserted in a mask pattern. A general computer can execute the software codes. During operation of the software code, the software codes or their associated data are stored in a general computer platform. In some cases, the software is stored in another site or loaded by another appropriate general computer system. Accordingly, at least one machine-readable recording medium can hold the software codes as one or a plurality of modules. The invention to be described hereafter is written in the code form as described above and can function as one or a plurality of software products. A processor of the computer system executes the software codes. The computer platform can execute methods to be described in this specification and shown in the embodiments, a catalog, or a software download function.

Figure 1:
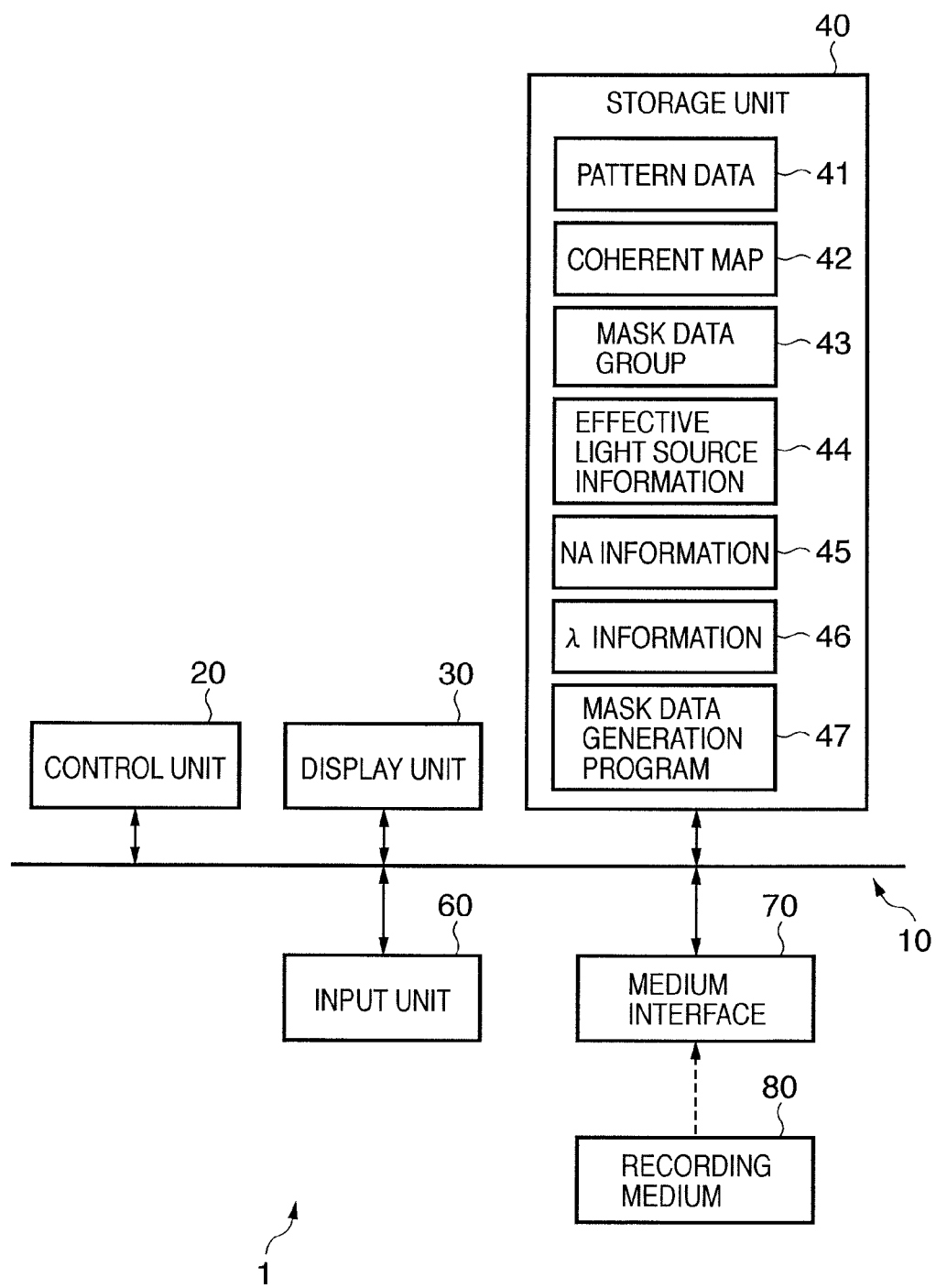
FIG. 1 is a block diagram showing the configuration of a computer according to an embodiment of the present invention.

The configuration of a computer for executing a mask data generation program according to an embodiment of the present invention will be explained with reference to FIG. 1.

A computer 1 comprises a bus 10, control unit 20, display unit 30, storage unit 40, input unit 60, and medium interface 70.

The control unit 20, display unit 30, storage unit 40, input unit 60, and medium interface 70 connect to each other via the bus 10. The medium interface 70 is connectable to a recording medium 80.

The storage unit 40 stores pattern data 41, coherent map 42, mask data group 43, effective light source information 44, NA information 45, λ information 46, and mask data generation program 47, which generates mask data. The pattern data 41 is data of a pattern (to be referred to as a layout pattern hereafter) having the layout design of, for example, an integrated circuit. As will be described later, the coherent map 42 expresses a coherence distribution on a plane (the object plane of a projection optical system) on which a mask is arranged. The mask data group 43 includes first mask data, second mask data, ..., $N^{th}$ (N is a natural number) mask data. The first to $N^{th}$ mask data are respectively used to draw patterns of, for example, Cr on the first to $N^{th}$ masks. The effective light source information 44 is associated with a light intensity distribution formed on the pupil plane of the projection optical system in an exposure apparatus 100 (see FIG. 23; to be described later). The NA information 45 is associated with an image side numerical aperture NA of the projection optical system in the exposure apparatus 100. The λ information 46 is associated with the wavelength λ of exposure light. The mask data generation program 47 is used to generate mask data.

The control unit 20 is, for example, a CPU, GPU, DSP, or a microcomputer, and further includes a cache memory for temporal storage. Examples of the display unit 30 are a CRT display and a liquid crystal display. Examples of the storage unit 40 are a memory a hard disk. Examples of the input unit 60 are a keyboard and a mouse. Examples of the medium interface 70 are a floppy (Japanese registered trademark) disk drive, a CD-ROM drive, and a USB interface. Examples of the recording medium 80 are a floppy disk, a CD-ROM, and USB memory.

The arrangement of the coherent map 42 according to the embodiment of the present invention will be explained.

Let λ be the wavelength of exposure light of the exposure apparatus 100 (see FIG. 23), NA be the image side numerical aperture of the projection optical system, and σ be the ratio between the object side numerical aperture of the projection optical system and a numerical aperture formed by the light beam guided to the mask surface by the illumination optical system.

Since the exposure apparatus can take various NA and λ values, it is convenient to normalize the pattern size by (λ/NA). For example, if λ is 248 nm and NA is 0.73, 100 nm is normalized into 0.29 in the above-described manner. This normalization will be called "conversion by a k1 value" throughout this specification. The size here means the length of one side of a pattern.

A pattern (to be referred to as a mask pattern hereafter) of, for example, Cr drawn on the mask, has a size different from that of a pattern (to be referred to as a wafer pattern hereafter) formed on the wafer surface by the magnification of the projection optical system. For the sake of simplicity, a dimension (coordinate position) on the mask surface (the object plane of the projection optical system) is indicated by a magnitude corresponding to the size of the wafer pattern obtained by multiplying the size of the mask pattern by the magnification of the projection optical system such that the sizes of the mask pattern and wafer pattern have a one-to-one correspondence. The mask surface here means the object plane of the projection optical system, on which the mask is arranged.

A mask pattern and wafer pattern in the semiconductor exposure apparatus have a partial coherent imaging relationship. The partial coherent imaging requires effective light source information 44 to detect coherence on the mask surface. The coherence here means the degree of interference corresponding to distance on the mask surface. For example, when two elements of the mask pattern are arranged at a distance at which the coherence is zero, light beams diffracted by the two elements never interfere with each other.

The coherence can be obtained by Fourier-transforming an effective light source in accordance with the van Cittert-Zernike theorem. More strictly speaking, the coherence is given as the absolute value of the Fourier transform of the effective light source. In the following description, the absolute value of the Fourier transform of the effective light source will be called a coherent map, for convenience.

The coherent map 42 expresses a coherence distribution on the mask surface, and always takes positive values. In contrast, the above-described conventional interference map expresses an approximate distribution of imaging plane amplitude, and takes positive or negative values. For this reason, the coherent map 42 and interference map deal with completely different physical quantities and have completely different properties.

Figure 4:
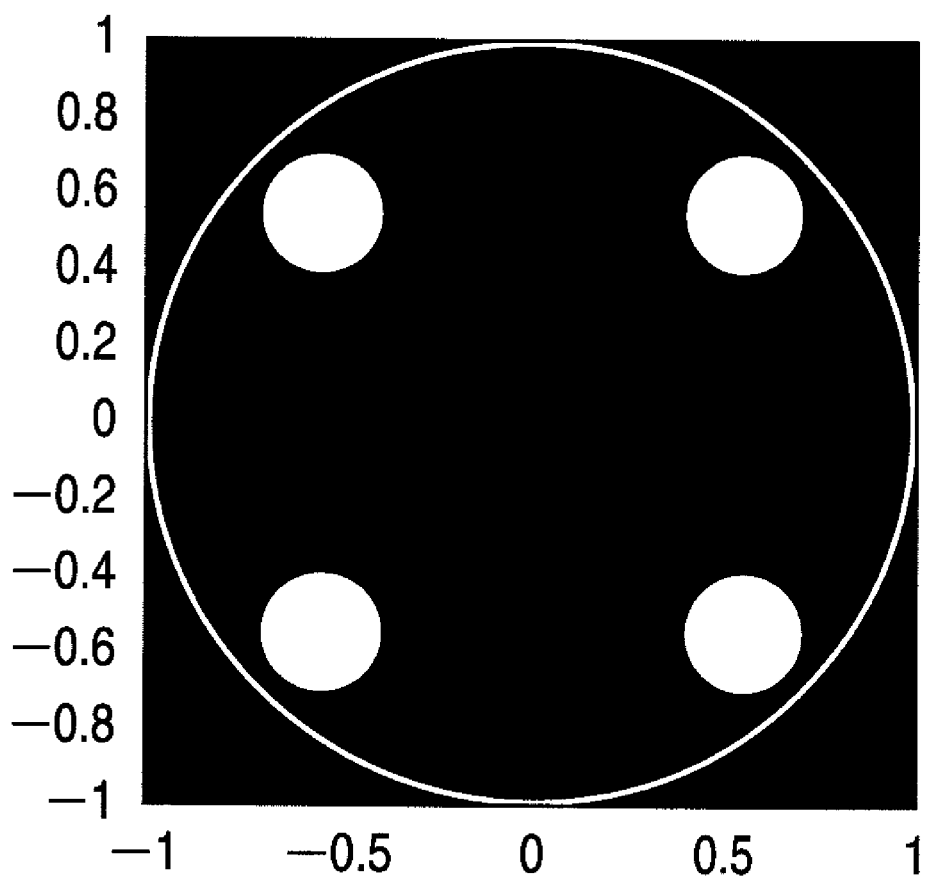
FIG. 4 is a graph showing an effective light source according to the embodiment of the present invention.
Figure 5:
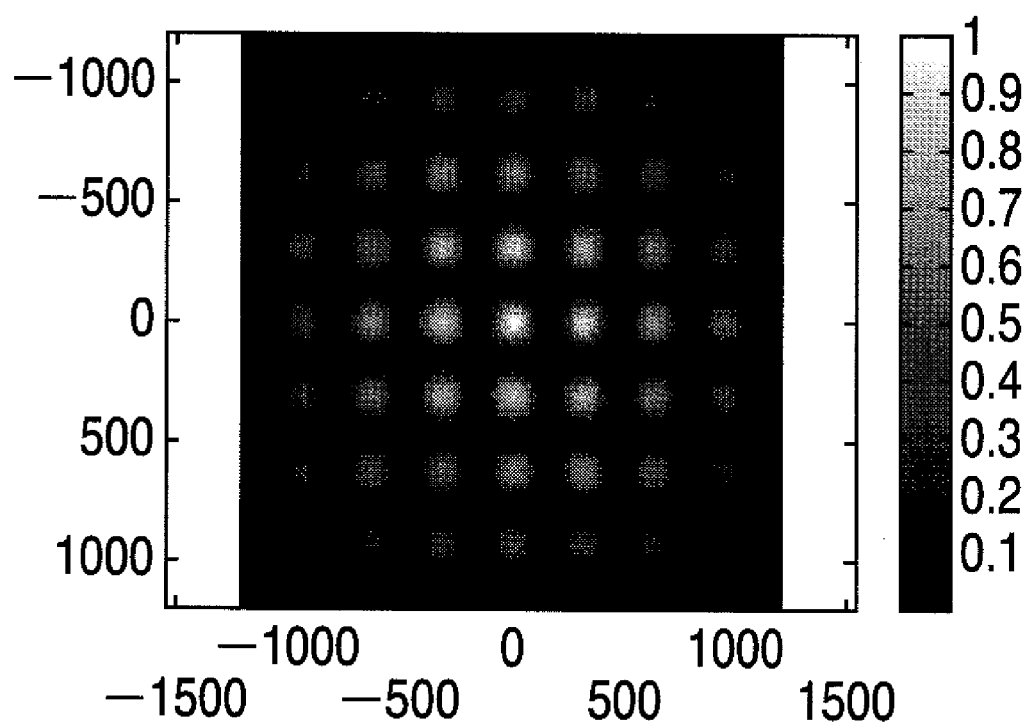
FIG. 5 is a graph showing a coherent map according to the embodiment of the present invention.

FIG. 4 exemplifies the effective light source (effective light source information 44). FIG. 5 exemplifies the coherent map 42.

FIG. 4 shows a light intensity distribution formed on the pupil plane of the projection optical system by the illumination optical system without a mask. Referring to FIG. 4, the light intensity distribution is normalized, assuming that the radius of the pupil of the projection optical system is one. White portions indicate light irradiated regions, and a circle, which has a radius of one, and is drawn by a white line, indicates σ=1. The NA (the image side numerical aperture of the projection optical system) of the exposure apparatus is 0.73, and the wavelength is 248 nm.

FIG. 5 shows the coherent map 42 obtained by Fourier-transforming a function indicating the effective light source shown in FIG. 4. Referring to FIG. 5, the abscissa indicates the x coordinate of the mask surface (unit: nm), and the ordinate indicates the y coordinate of the mask surface (unit: nm). FIG. 5 expresses coherence on the mask surface with respect to the origin (0 nm, 0 nm).

Referring to FIG. 5, as a value (color density value) when a highlight portion becomes close to one, the coherence with light from the origin increases. As the color density value becomes close to zero, the coherence with light from the origin decreases. For example, light beams from positions (±310 nm, 0 nm), (0 nm, ±310 nm), and (±310 nm, ±310 nm) on the mask surface have high coherence with a light beam from the origin on the imaging plane of the projection optical system. To the contrary, light beams from positions (±160 nm, ±310 nm) and (±310 nm, ±160 nm) have low coherence with the light beam from the origin on the imaging plane of the projection optical system. That is, the relationship between the origin and each of the positions (±160 nm, ±310 nm) and (±310 nm, ±160 nm) indicates a forbidden pitch. The thus obtained forbidden pitch contains information associated with λ, NA, and effective light source.

When the forbidden pitch is detected, an element existing at the forbidden pitch is removed from the layout pattern (pattern data 41), including a plurality of elements, to generate one pattern data free from any forbidden pitches, and the removed element is set as removed pattern data. Then, another element existing at the forbidden pitch is removed from the removed pattern data to generate other pattern data free from any forbidden pitches. Repeating such procedures makes it possible to generate pattern data, which attain a favorable depth of focus.

A processing sequence for generating mask data by executing a mask data generation program will be explained with reference to the flowchart shown in FIGS. 2 and 3.

In step S1, the control unit 20 of the computer 1 determines an effective light source.

That is, the user inputs information associated with an effective light source to the input unit 60 in advance. Upon receiving the information associated with the effective light source, the control unit 20 stores it in the storage unit 40 as the effective light source information 44. The pattern data 41, NA information 45, and λ information 46 are also input to the input unit 60 in advance by the user, and stored in the storage unit 40 via the control unit 20.

The recording medium 80, which records the mask data generation program 47, connects to the medium interface 70. The mask data generation program 47 is installed in the computer 1 and stored in the storage unit 40 via the control unit 20.

The user inputs an instruction to start up the mask data generation program 47 to the input unit 60. Upon receiving the instruction to start up the mask data generation program 47, the control unit 20 refers to the storage unit 40 and starts up the mask data generation program 47 on the basis of this instruction. The control unit 20 then controls the display unit 30 to display effective light source information 44 in accordance with the mask data generation program 47. The user having browsed the effective light source information 44 inputs an instruction to select the effective light source to the input unit 60. On the basis of the effective light source information 44 and the instruction to select the effective light source, the control unit 20 determines the effective light source (see FIG. 4) and holds the determined effective light source information.

In step S2, the control unit 20 of the computer 1 generates a coherent map 42.

That is, the user inputs an instruction to generate a coherent map 42 to the input unit 60. Upon receiving the instruction to generate a coherent map 42, the control unit 20 refers to the storage unit 40 and receives the NA information 45 and λ information 46 on the basis of this instruction. On the basis of the effective light source information, the control unit 20 generates a function indicating the effective light source. On the basis of the NA information 45 and λ information 46, the control unit 20 Fourier-transforms the function indicating the effective light source to generate coherent map 42 (see FIG. 5). The control unit 20 then controls the display unit 30 to display the coherent map 42.

In step S3, the control unit 20 of the computer 1 specifies reference vectors. The reference vectors express forbidden pitches, as will be described later.

That is, the user inputs an instruction to specify reference vectors to the input unit 60. Upon receiving the instruction to specify the reference vectors, the control unit 20 specifies the reference vectors by extracting the vector amounts from the origin of the coherent map 42 to regions in each of which the coherence is lower than reference value, on the basis of this instruction.

Figure 2:
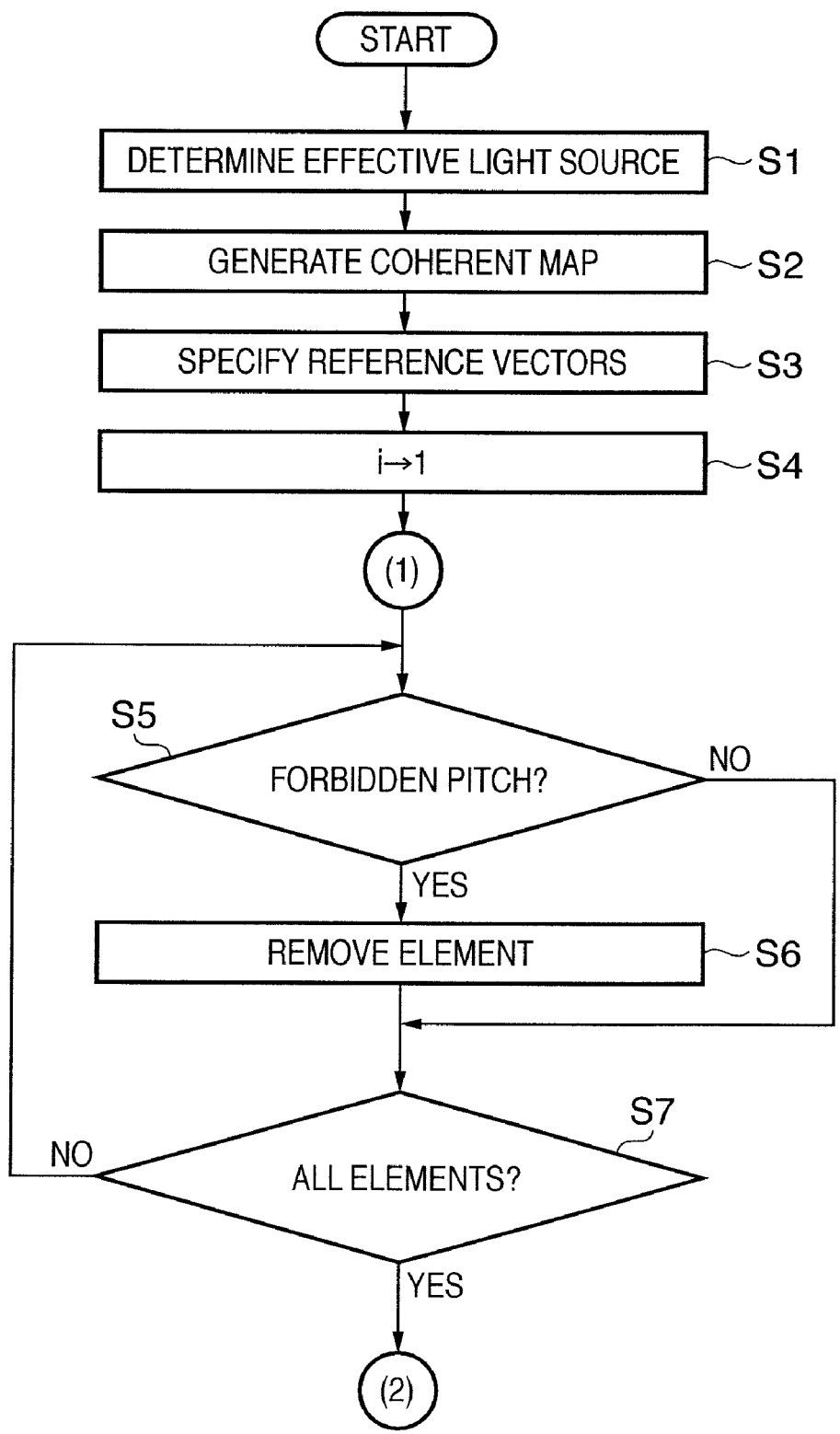
FIG. 2 is a flowchart illustrating a processing sequence for generating mask data (the embodiment of the present invention)

In step S4, the control unit 20 of the computer 1 sets an initial value "1" to a reference number i of pattern data to be generated in a subsequent step ((1) shown in FIG. 2).

In step S5, the control unit 20 of the computer 1 determines whether the pattern data 41 has an element, which is positioned at a forbidden pitch indicated by any one of the reference vectors.

That is, the user inputs an instruction to determine the presence/absence of an element, which is positioned at a forbidden pitch indicated by any one of the reference vectors. Upon receiving the instruction to determine the presence/absence of an element, which is positioned at a forbidden pitch indicated by any one of the reference vectors, the control unit 20 refers to the storage unit 40 and receives the pattern data 41 on the basis of this instruction. The control unit 20 selects, as an element of interest, a certain element among a plurality of elements of the processing target pattern data 41. The control unit 20 then determines whether an element exists at a position matching the terminal point of the reference vector arranged such that the center of the selected element of interest serves as the starting point. If, for example, the element is a square, the center of the element is the intersection between the diagonal lines of the square. If the element is a rectangle, the center of the element is the intersection between the diagonal lines of the rectangle. If the control unit 20 determines that an element exists at the position matching the terminal point of the reference vector, the pattern data 41 has a forbidden pitch. If the control unit 20 determines that no element exists at the position matching the terminal point of the reference vector, the pattern data 41 has no forbidden pitch.

If the control unit 20 determines that the pattern data 41 has a forbidden pitch, the process advances to step S6. If the control unit 20 determines that the pattern data 41 has no forbidden pitch, the process advances to step S7.

In step S6, the control unit 20 of the computer 1 removes the element existing at the position matching the terminal point of the reference vector from the pattern data 41, and temporarily stores information about the removed element in the cache memory.

In step S7, the control unit 20 of the computer 1 determines whether all the elements left unremoved of the plurality of elements of the pattern data 41 have undergone a determination in step S5. If the control unit 20 determines that all the elements have undergone a determination, the process advances to step S8 ((2) shown in FIGS. 2 and 3). If the control unit 20 determines that not all the elements have undergone a determination, the process returns to step S5.

In step S8, the control unit 20 of the computer 1 generates $i^{th}$ pattern data (pattern data with a reference number i).

If i=1, the control unit 20 sets (generates), as the $i^{th}$ pattern data, pattern data which is obtained as the remaining portion by removing all the elements from the pattern data 41 (pattern data serving as initial processing target) in the last step S6, each of which is existing at the position matching the terminal point of the reference vector. The control unit 20 holds removed pattern data, which is obtained as the removed portion in the last step S6 in the cache memory. If i≧2, the control unit 20 sets (generates), as the $i^{th}$ pattern data, pattern data, which is obtained as the remaining portion by removing all the elements from previously removed pattern data (pattern data serving as a temporary processing target) in the last step S6, each of which is existing at the position matching the terminal point of the reference vector. The control unit 20 holds removed pattern data (if any), which is obtained as the removed portion in the last step S6 in the cache memory. That is, one element is selected as a new element of interest from pattern data serving as a processing target, and a reference vector is arranged such that the center of the selected element serves as the starting point. Pattern data (to be referred to as the first pattern data) different from the pattern data serving as a processing target is generated as the remaining portion by removing all the elements, each of which is existing at the position matching the terminal point of the reference vector from the pattern data. Pattern data having the elements removed in generating the first pattern data (removed portion) is generated as the second pattern data.

In step S9, the control unit 20 of the computer 1 newly sets (i+1) as i by incrementing the reference number i of the pattern data by one.

In step S10, the control unit 20 of the computer 1 shifts the origin of the coherent map 42.

That is, the user inputs an instruction to display the $i^{th}$ pattern data to the input unit 60. Upon receiving the instruction to display the $i^{th}$ pattern data, the control unit 20 controls the display unit 30 to display the $i^{th}$ pattern data, on the basis of this instruction. With this operation, the display unit 30 simultaneously displays the $i^{th}$ pattern data and coherent map 42. The user, having browsed the $i^{th}$ pattern data and coherent map 42, inputs an instruction to select an element of interest among a plurality of elements included in the $i^{th}$ pattern data to the input unit 60. Upon receiving the instruction to select the element of interest, the control unit 20 shifts the origin of the coherent map 42 to the center of the element of interest of the $i^{th}$ pattern data and matches them on the basis of this instruction. The control unit 20 then controls the display unit 30 to display the $i^{th}$ pattern data and the coherent map 42 with the origin being shifted. In addition, the control unit 20 generates $i^{th}$ mask data 43 using the element of interest as the main pattern, and stores it in the storage unit 40.

In step S11, the control unit 20 of the computer 1 arranges an auxiliary pattern.

That is, the user having browsed the pattern data 41 and the coherent map 42 with the origin being shifted inputs an instruction to arrange an auxiliary pattern to the input unit 60. Upon receiving the instruction to arrange the auxiliary pattern, the control unit 20 additionally arranges the auxiliary pattern in a region where the coherence is equal to or higher than a threshold (set value), on the basis of this instruction. The control unit 20 refers to the storage unit 40 and sets the mask data 43, including the auxiliary pattern information, as new mask data 43. The control unit 20 then controls the display unit 30 to display the mask data 43 in place of the pattern data 41. In addition, the control unit 20 stores the mask data 43 in the storage unit 40.

In step S12, the control unit 20 of the computer 1 refers to the cache memory and determines whether a removed element exists. If the control unit 20 determines that a removed element exists, the process advances to step S13. If the control unit 20 determines that no removed element exists, the process ends.

Figure 3:
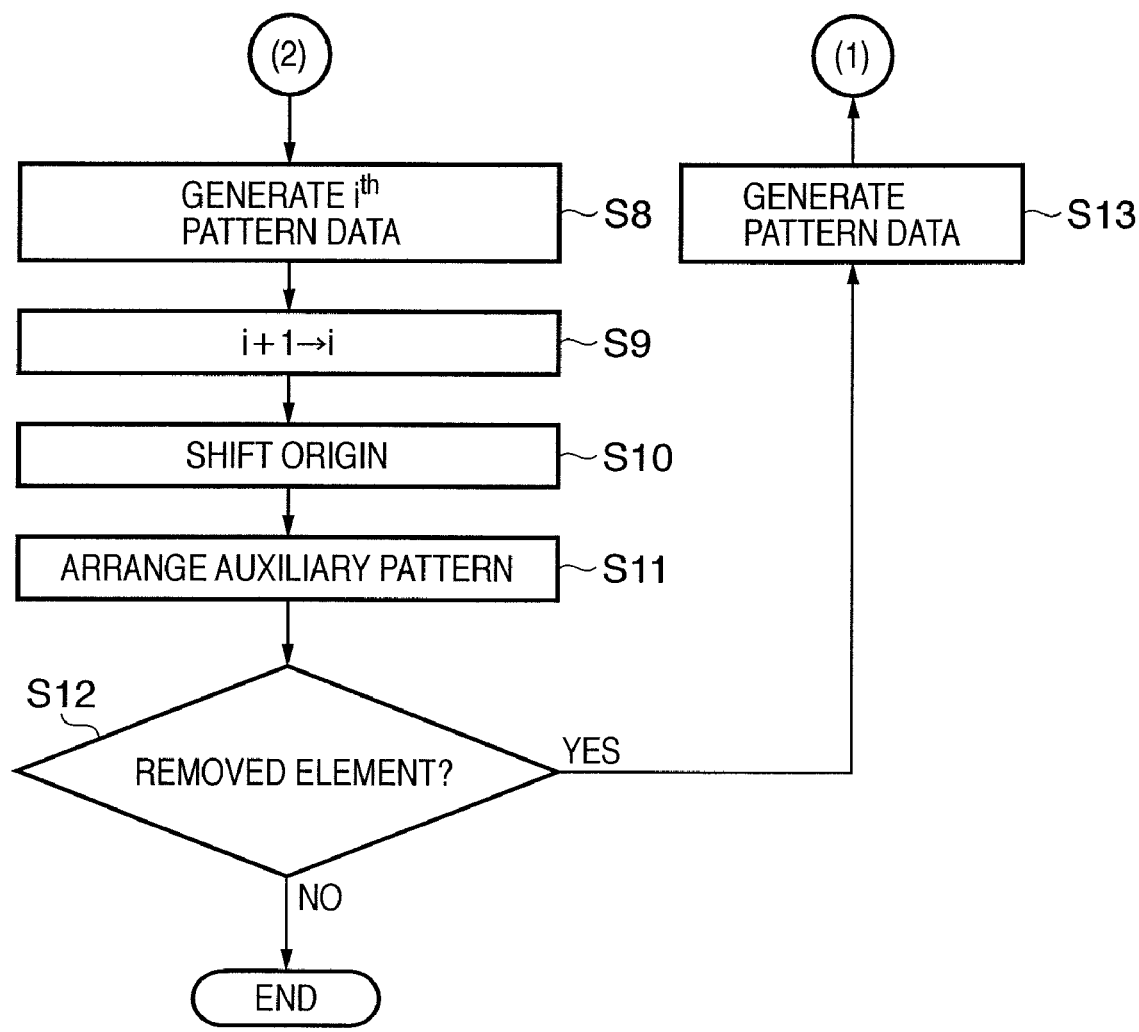
FIG. 3 is a flowchart illustrating the processing sequence for generating mask data (the embodiment of the present invention)

In step S13, the control unit 20 of the computer 1 generates new processing target pattern data 41 (second pattern data) having the elements removed in generating the $i^{th}$ pattern data ((1) shown in FIGS. 2 and 3).

As described above, the process by the mask data generation program 47 according to this embodiment can generate, using the coherent map 42, a group of mask data 43 in which auxiliary patterns are arranged at appropriate positions. That is, the process by the mask data generation program 47 can generate a group of mask data 43, in which auxiliary patterns are arranged at appropriate positions, without calculating either the TCC or eigenfunction, thus simplifying the whole numerical calculation. This makes it possible to shorten the generation time of the mask data group 43 for multiple exposure.

When an EB drawing apparatus receives the first to $N^{th}$ mask data as a mask fabrication method, it can draw patterns of, that is, Cr corresponding to the first to $N^{th}$ mask data on respective masks 130. This makes it possible to fabricate the masks 130 for multiple exposure. Of the plurality of masks, a mask fabricated from the first pattern data is the first mask and that fabricated from the second pattern data is the second mask.

A forbidden pitch checking method will be explained.

To check a forbidden pitch, there is available a method of inserting an auxiliary pattern that is not resolvable around an isolated pattern, and evaluating the imaging characteristic of the isolated pattern.

Figure 6:
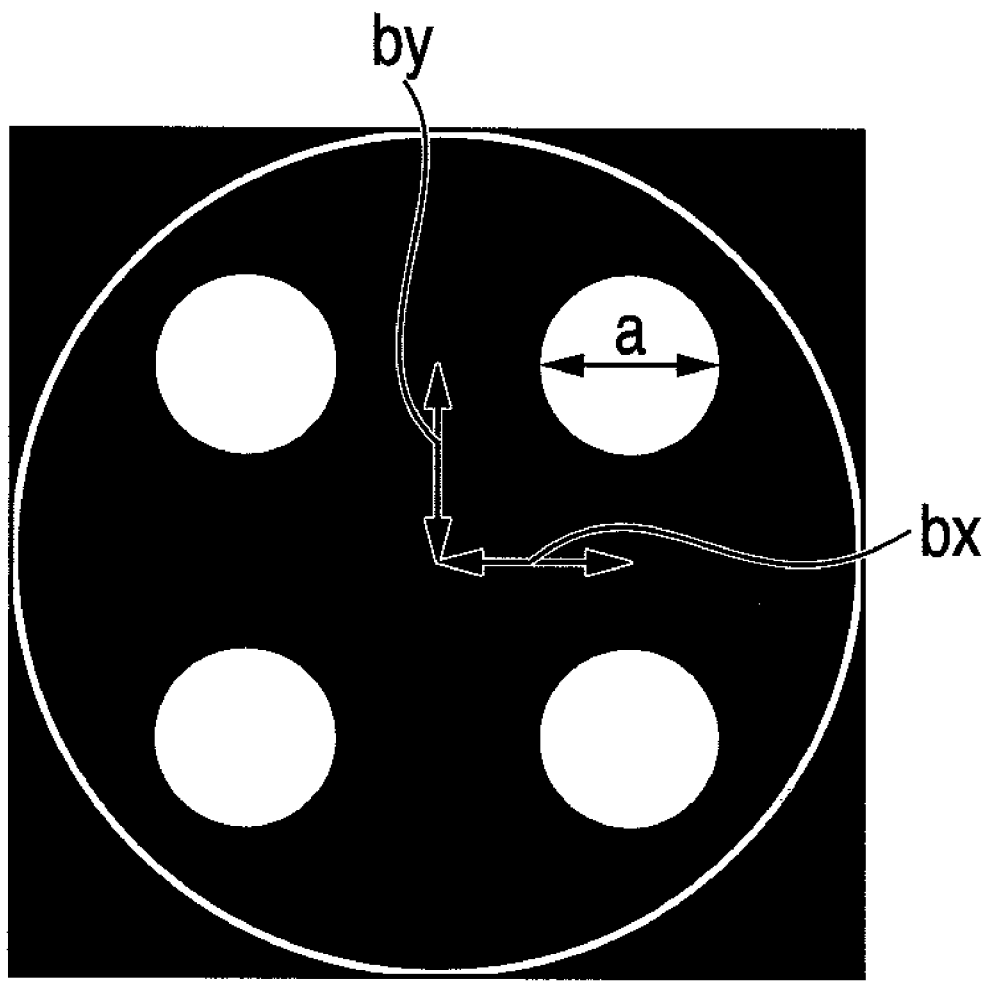
FIG. 6 is a view showing an effective light source in a forbidden pitch checking method.

Assume that the NA of an exposure apparatus 100 (see FIG. 23) is 0.73, and that the wavelength λ of exposure light is 248 nm, and that the size of a contact hole to be exposed is 120 nm. An effective light source has an appearance as shown in FIG. 6. A circle, which has a radius of one and is drawn by a white line in FIG. 6, indicates σ=1. White portions indicate light irradiated portions, which are called poles in this specification. The distance from σ=0 to the center of each pole is given such that the distance in the abscissa direction, that is, x direction is bx=0.55 (upon conversion into a σ value), and the distance in the ordinate direction, that is, y direction is by=0.55 (upon conversion into a σ value). A diameter a of each pole is 0.2 when converting the diameter into a σ value. A value obtained upon conversion into the σ value indicates a magnitude obtained by normalization assuming that the radius of the pupil of a projection optical system is one.

Figure 7:
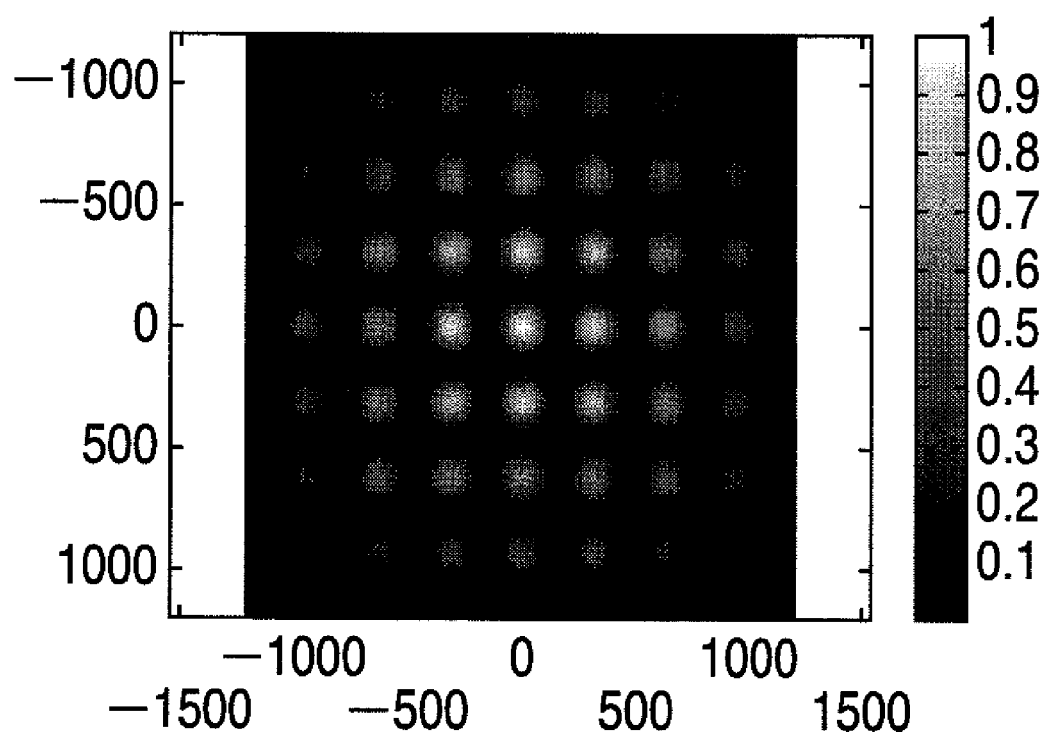
FIG. 7 is a graph showing a coherent map in the forbidden pitch checking method.

First, a control unit 20 generates a coherent map 42, as shown in FIG. 7. The scale of FIG. 7 is identical to that shown in FIG. 5. Next, the control unit 20 determines the coherence threshold value (set value). For example, the control unit 20 determines the coherence threshold value as 0.5. FIG. 7 shows regions where the coherence exceeds 0.5 (set value) in the coherent map 42. Positions where the coherence exceeds the threshold value and corresponds to a peak are (±310 nm, 0 nm), (0 nm, ±310 nm), and (±310 nm, ±310 nm) on the mask. These positions exhibit high coherence. In view of this, the control unit 20 arranges a main pattern MP101 at the origin of mask data, shown in FIG. 8, and arranges auxiliary patterns SP101 to SP108 at an interval d=310 nm. The scale of FIG. 8 is identical to that shown in FIG. 5.

The control unit 20 also determines the reference value of coherence. The control unit 20 sets the reference value of coherence to, for example, 0.1. Positions where the coherence is lower than the reference value and corresponds to a local minimal value are (±160 nm, ±310 nm) and (±310 nm, ±160 nm), on the mask. These positions exhibit low coherence. The control unit 20 arranges the main pattern MP101 at the origin of mask data shown in FIG. 9, and arranges auxiliary patterns FP101 to FP108 at low-coherence positions. The scale of FIG. 9 is identical to that shown in FIG. 5. A mask based on the data shown in FIG. 8 is fabricated by the auxiliary pattern insertion method according to the present invention.

Figure 8:
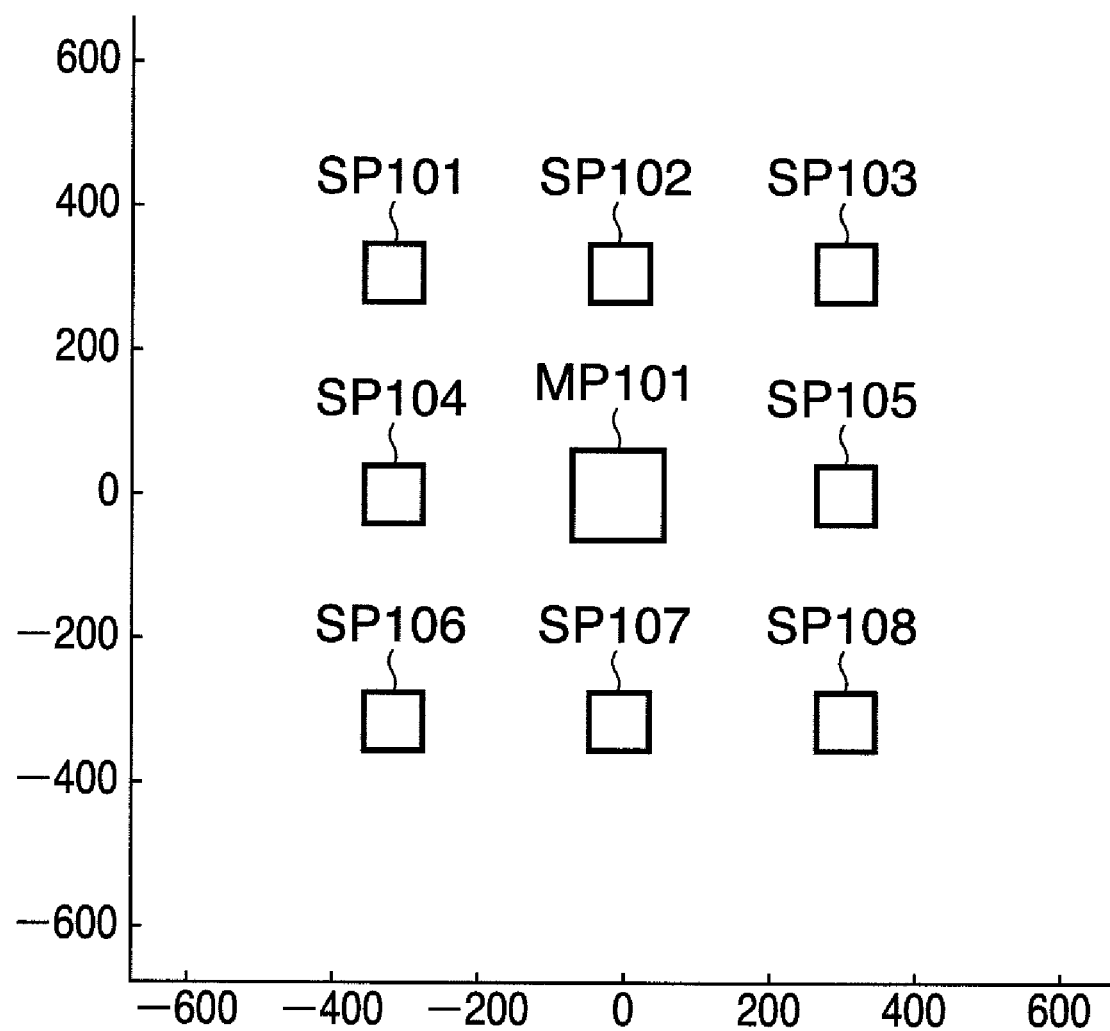
FIG. 8 is a graph showing mask data in the forbidden pitch checking method.
Figure 9:
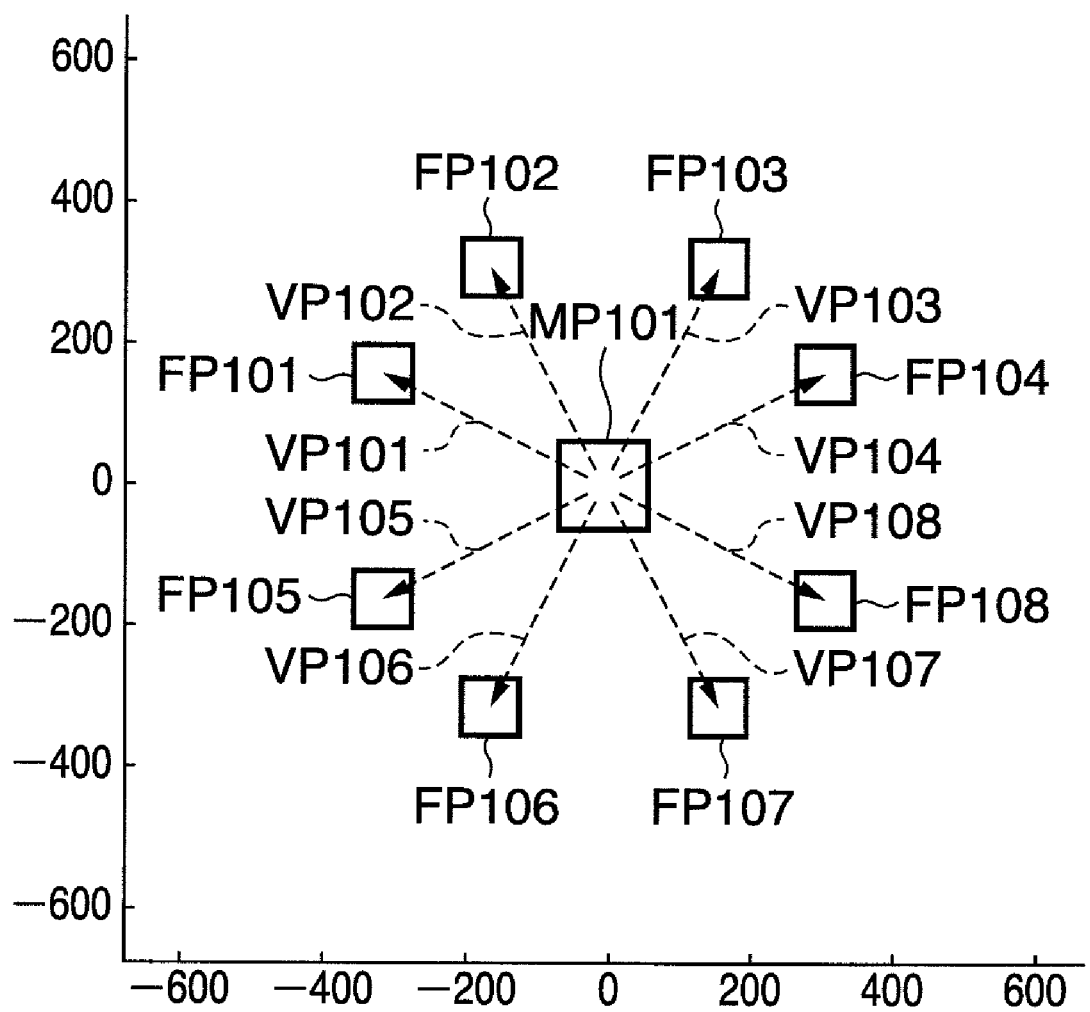
FIG. 9 is a graph showing another mask data in the forbidden pitch checking method.

All the auxiliary patterns SP101 to SP108, shown in FIG. 8, and the auxiliary patterns FP101 to FP108, shown in FIG. 9, have a size of 80 nm. FIG. 8 shows eight auxiliary patterns SP101 to SP108, and FIG. 9 shows eight auxiliary patterns FP101 to FP108. A mask based on the data shown in FIG. 9 indicates a forbidden pitch checking method.

The simulation result of the imaging characteristic of a mask without any auxiliary patterns, that of a mask fabricated by the auxiliary pattern insertion method according to the present invention, and that of a mask indicating the forbidden pitch checking method are compared with each other.

Figure 10:
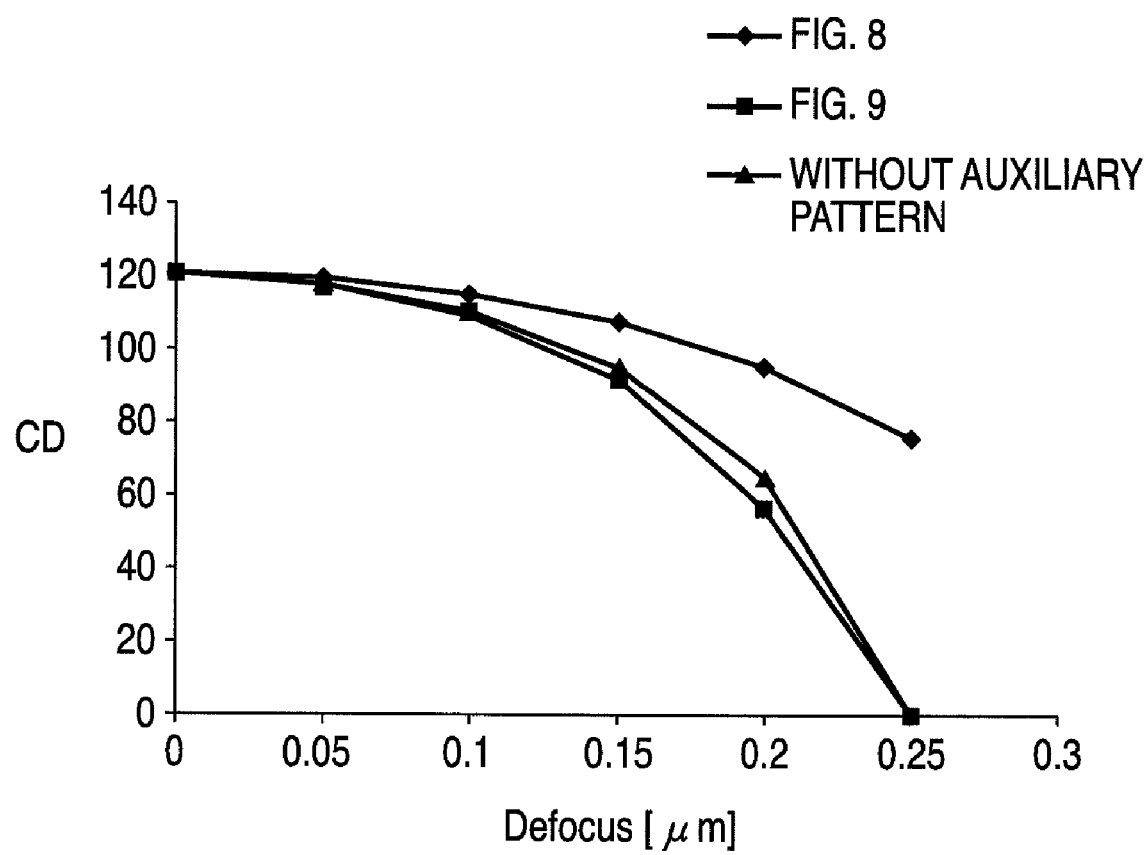
FIG. 10 is a graph showing the simulation result of imaging characteristics in the forbidden pitch checking method.

FIG. 10 shows the simulation result of imaging characteristics. Referring to FIG. 10, the abscissa indicates the amount of defocus, and the ordinate indicates the hole diameter (CD; Critical Dimension). Referring to FIG. 10, the graph indicated by triangular marks exhibits the imaging characteristic of a mask without any auxiliary patterns. The graph indicated by rhombic marks exhibits the imaging characteristic of a mask fabricated by the auxiliary pattern insertion method according to the present invention. The graph indicated by square marks exhibits the imaging characteristic of a mask indicating the forbidden pitch checking method.

It has conventionally been said that auxiliary pattern insertion improves the defocus versus CD characteristic. Actually, the mask shown in FIG. 8 has a better defocus versus CD characteristic than that of the mask without any auxiliary patterns. That is, the mask shown in FIG. 8 improves the imaging characteristic and, hence, is advantageous to accurate micropattern formation.

However, the mask shown in FIG. 9 has a poorer defocus versus CD characteristic than that of the mask without any auxiliary patterns. This result can be interpreted that auxiliary patterns are inserted at forbidden pitches, leading to degradation in defocus versus CD characteristic.

That is, positions which exhibit poor coherence on the coherent map indicate forbidden pitches with respect to the origin. Although the forbidden pitch is often thought, from its name, to be a phenomenon which depends on only the distance, FIG. 9 reveals that the direction is also involved in this phenomenon. That is, the forbidden pitch depends on both the distance and direction. Hence, reference vectors VP101 to VP108 can express the forbidden pitches.

Embodiments of the present invention will be explained below.

First Working Example

Figure 11:
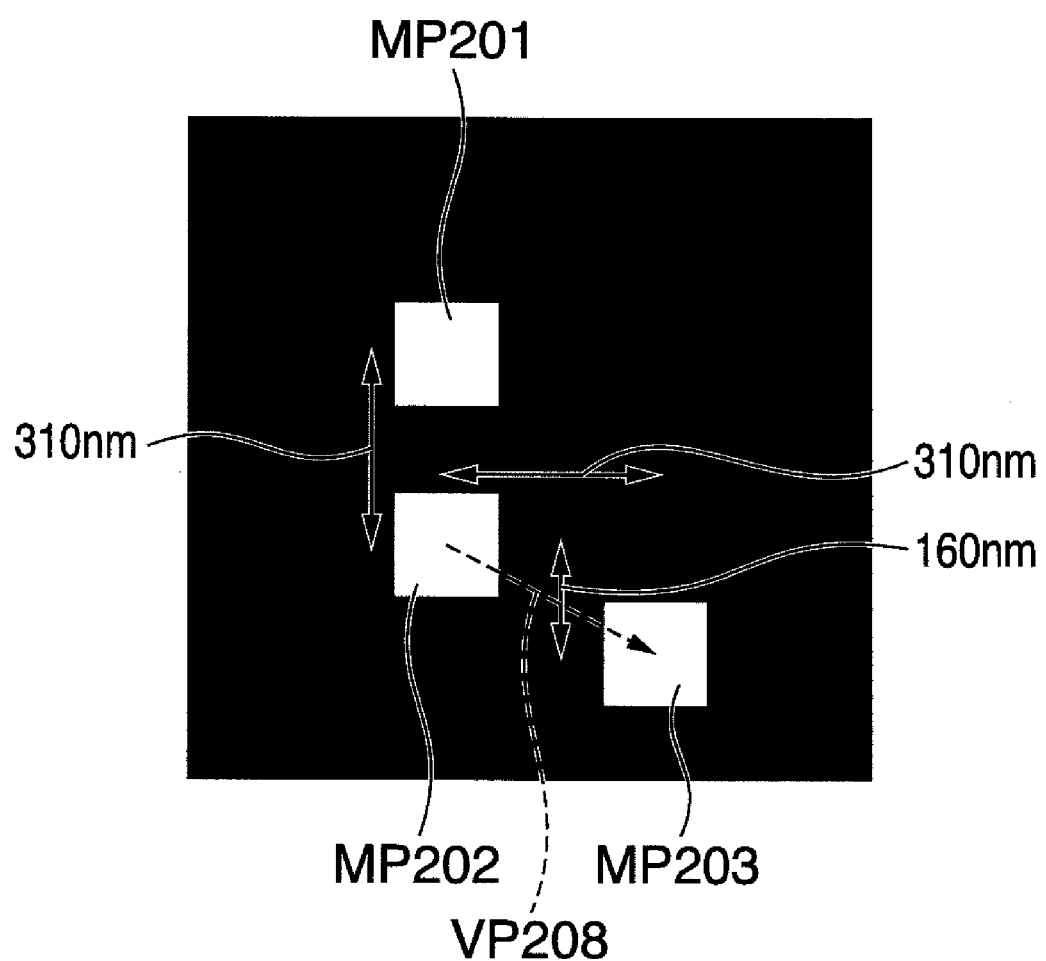
FIG. 11 is a view showing pattern data according to the first working example of the present invention.

Pattern data division using a coherent map 42 will be exemplified. The NA of an exposure apparatus 100 (see FIG. 23) is 0.73, and the wavelength λ of exposure light is 248 nm. Consider a case wherein pattern data 41 (layout pattern), shown in FIG. 11, is a processing target. The pattern data 41, shown in FIG. 11, includes patterns of three contact holes MP201 to MP203. The patterns of the three contact holes MP201 to MP203 have a size of 120 nm.

The contact hole MP202 is spaced apart from the contact hole MP201 by −310 nm in the y direction. The contact hole MP203 is spaced apart from the contact hole MP202 by 310 nm in the x direction and by −160 nm in the y direction.

Figure 12:
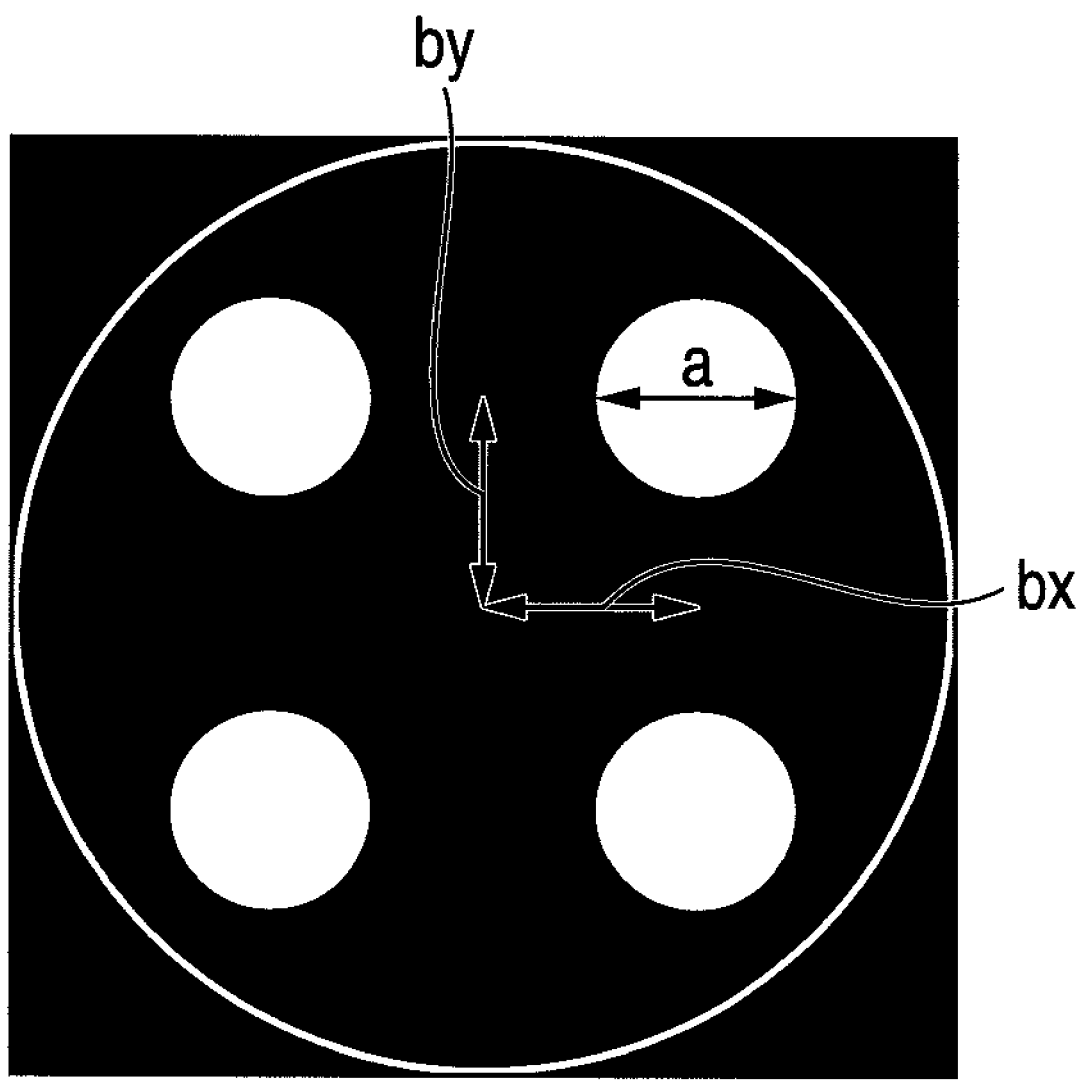
FIG. 12 is a view showing an effective light source according to the first working example of the present invention.

Consider a case wherein an effective light source is of a quadrupole illumination shown in FIG. 12. A circle, which has a radius of one and is drawn by a white line, shown in FIG. 12, indicates σ=1. White portions indicate light irradiated portions. The distance from σ=0 to the center of each pole is given such that the distance in the abscissa direction, that is, x direction is bx=0.55 (upon conversion into a σ value), and the distance in the ordinate direction, that is, y direction is by=0.55 (upon conversion into a σ value). A diameter α of each pole is 0.3 when converting the diameter into a σ value.

Figure 13:
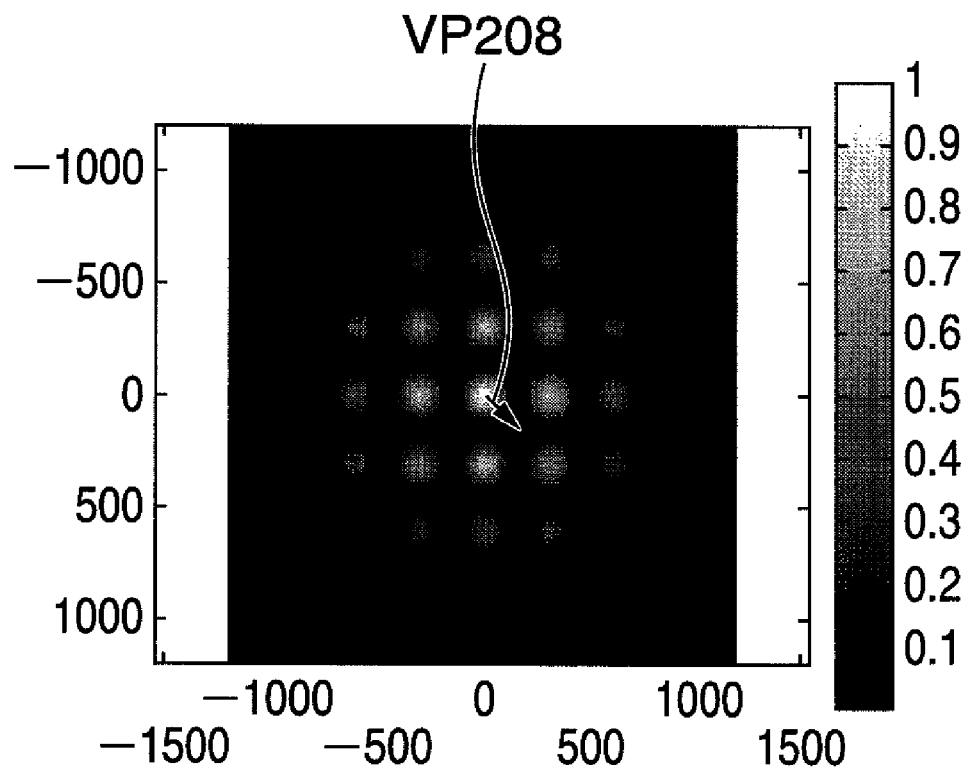
FIG. 13 is a graph showing a coherent map according to the first working example of the present invention.

A control unit 20 Fourier-transforms a function indicating the effective light source shown in FIG. 12, to generate a coherent map 42, shown in FIG. 13. The scale of FIG. 13 is identical to that shown in FIG. 5. Positions (±310 nm, 0 nm), (0 nm, ±310 nm), and (±310 nm, ±310 nm) on the mask exhibit high coherence with respect to the origin. To the contrary, positions (±160 nm, ±310 nm) and (+310 nm, ±160 nm) exhibit low coherence with respect to the origin.

Figure 14:
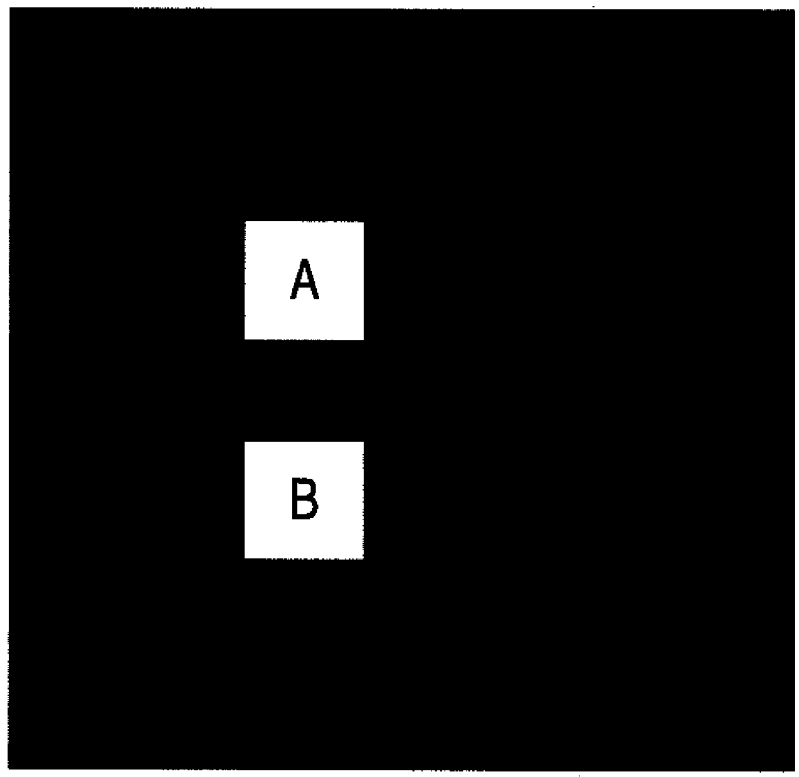
FIG. 14 is a view showing another pattern data according to the first working example of the present invention.

From the coherent map 42, shown in FIG. 13, the control unit 20 derives, for example, a reference vector VP208 expressing a forbidden pitch. The control unit 20 selects, as an element of interest, the element (contact hole) MP202 from the processing target pattern data 41, shown in FIG. 11. The control unit 20 determines that the element (contact hole) MP203 exists at a position matching the terminal point of the reference vector VP208 arranged such that the center of the selected element MP202 of interest serves as the starting point. That is, the contact holes MP202 and MP203 are determined to have a forbidden pitch relationship. The control unit 20 then removes the element MP203 existing at the position matching the terminal point of the reference vector VP208 from the pattern data 41, shown in FIG. 11, and generates first pattern data, shown in FIG. 14. From the element MP203, the control unit 20 generates second pattern data shown in FIG. 15. With this operation, the pattern data 41, shown in FIG. 11, is divided into the first pattern data, shown in FIG. 14, and the second pattern data, shown in FIG. 15. This division can generate data of two masks (first and second masks) free from any forbidden pitches.

As described above, inserting auxiliary patterns at high-coherence positions improves the defocus versus CD characteristic. Hence, inserting optimal auxiliary patterns in the divided masks and then exposing a substrate by using the divided masks improves the defocus versus CD characteristic as compared with simple double exposure.

A coherent map is an estimate of the degree of interference with the origin. That is, the coherent map 42 expresses the coherence between a light beam from a certain point and light beams from other points on the imaging plane of the optical system. The use of this coherence allows an improvement in imaging performance.

Figure 16:
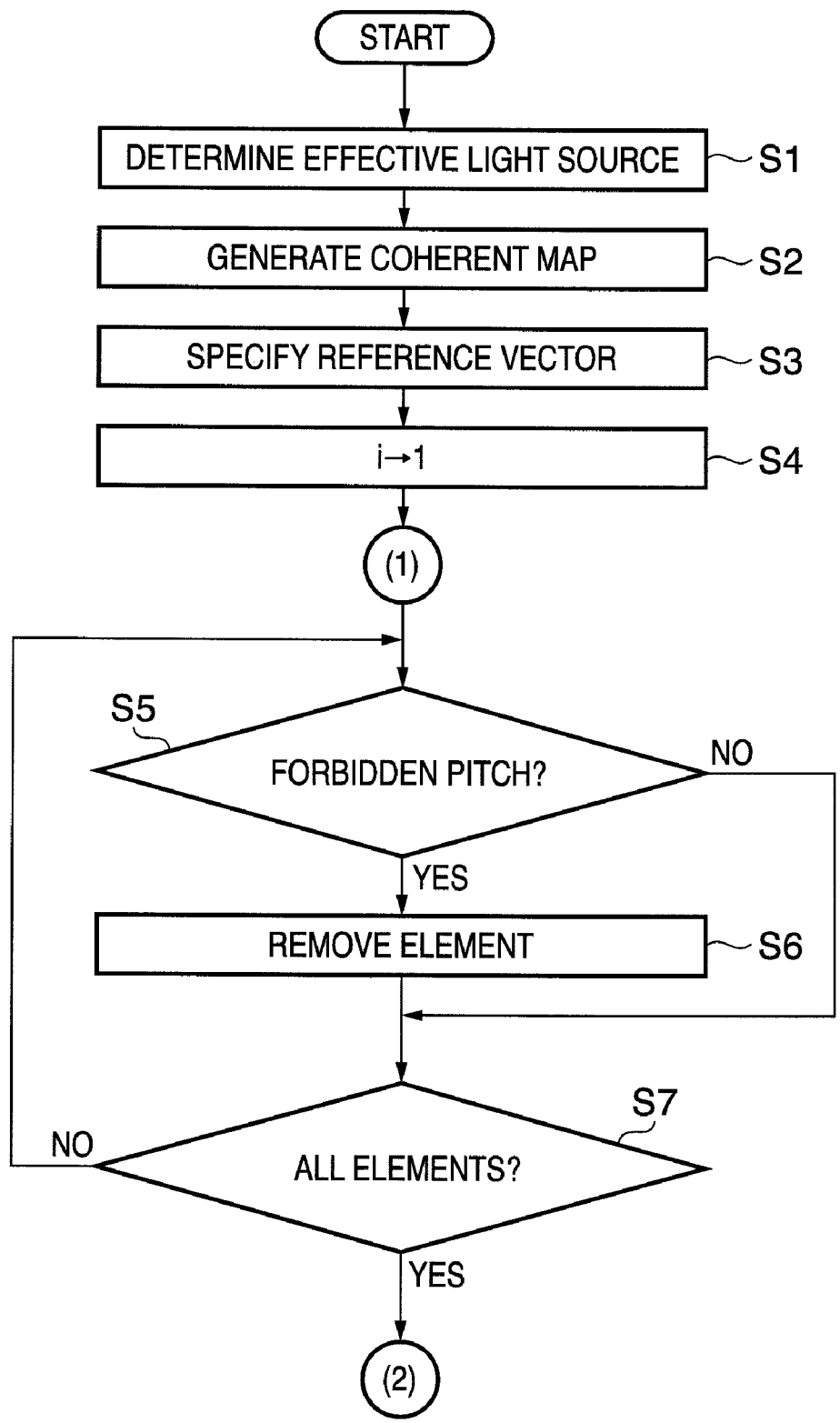
FIG. 16 is a flowchart illustrating a processing sequence for generating mask data (first working example)
Figure 17:
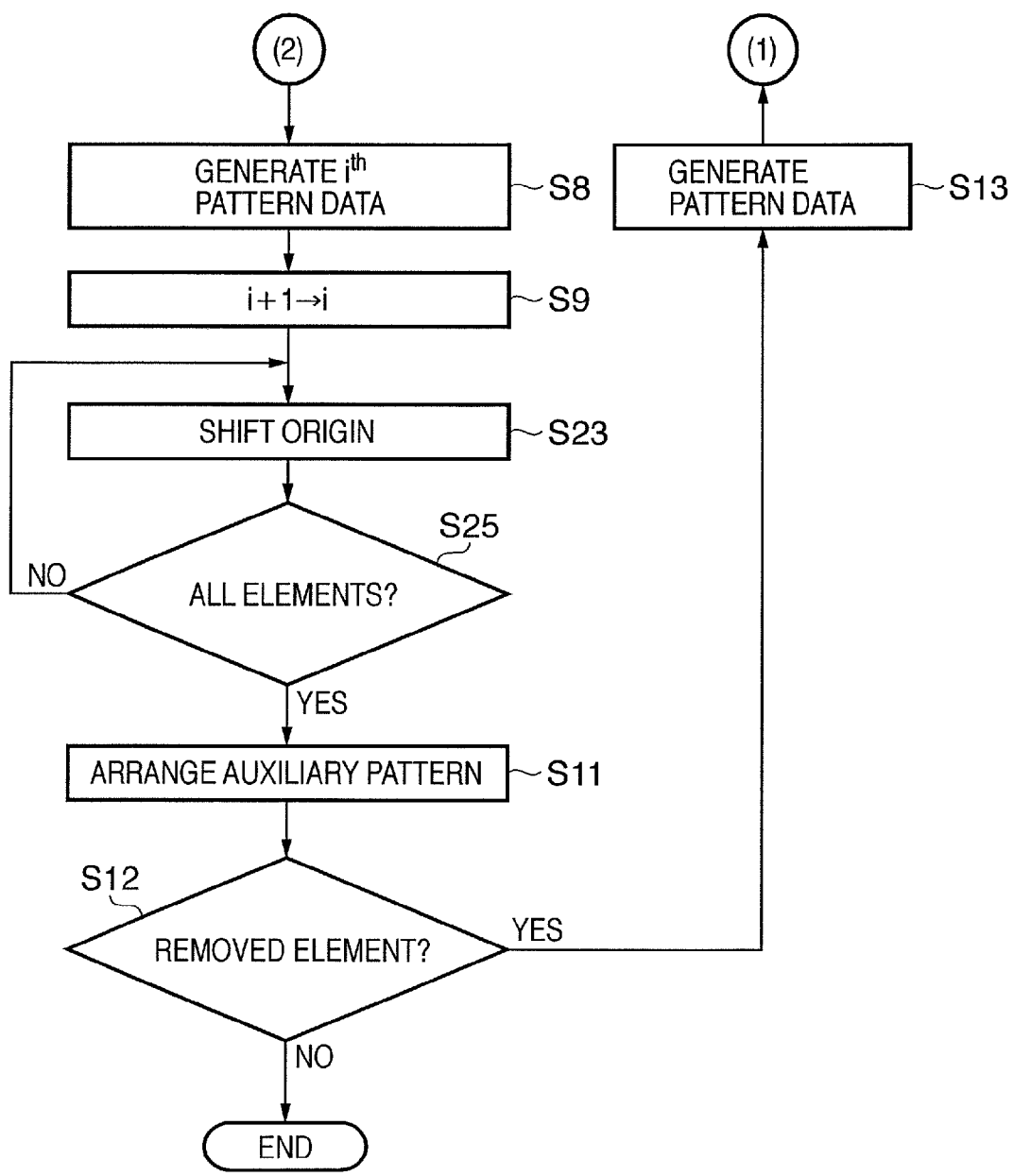
FIG. 17 is a flowchart illustrating the processing sequence for generating mask data (first working example)

When n contact hole patterns exist, they are individually processed as elements of interest. That is, a processing sequence for generating mask data by executing a mask data generation program shown in FIGS. 16 and 17 is different from that shown in FIGS. 2 and 3 in the following points. FIGS. 16 and 17 are flowcharts illustrating a processing sequence for generating mask data by executing a mask data generation program.

In step S23, the user, having browsed the $i^{th}$ pattern data and coherent map 42, inputs an instruction to select an element of interest from unselected contact holes of the n contact holes to an input unit 60. A control unit 20 adds the coherent map 42 with the origin being shifted to the center of the element of interest to a synthetic coherent map 42$i$ (i is a natural number) to generate a new synthetic coherent map 42$i$+1. The synthetic coherent map 42$i$ is obtained by overlapping coherent maps 42 for i elements of interest. Other points are the same as those in step S10, shown in FIG. 3.

In step S25, the control unit 20 determines whether all the elements of the $i^{th}$ pattern data, that is, all of the n contact holes have been selected. If the control unit 20 determines that all of the n contact holes have been selected, the process advances to step S11. If the control unit 20 determines that not all of the n contact holes have been selected, the process returns to step S23.

The process shown in FIG. 17 is formulated by equation (1). That is, letting f(x,y) be the coherent map 42, and (xi,yi) be the coordinate position of the center of an $i^{th}$ contact hole pattern, it suffices to determine, as a synthetic coherent map 42$n$, F1($x,y$) given by:

$$F1(x,y)=\Sigma f(x-xi, y-yi) \quad (1)$$

where i=1 to n. Then, it suffices to arrange auxiliary patterns at positions where F1($x,y$) exceeds a predetermined threshold value and corresponds to a peak, thus improving the imaging characteristic.

Figure 19:
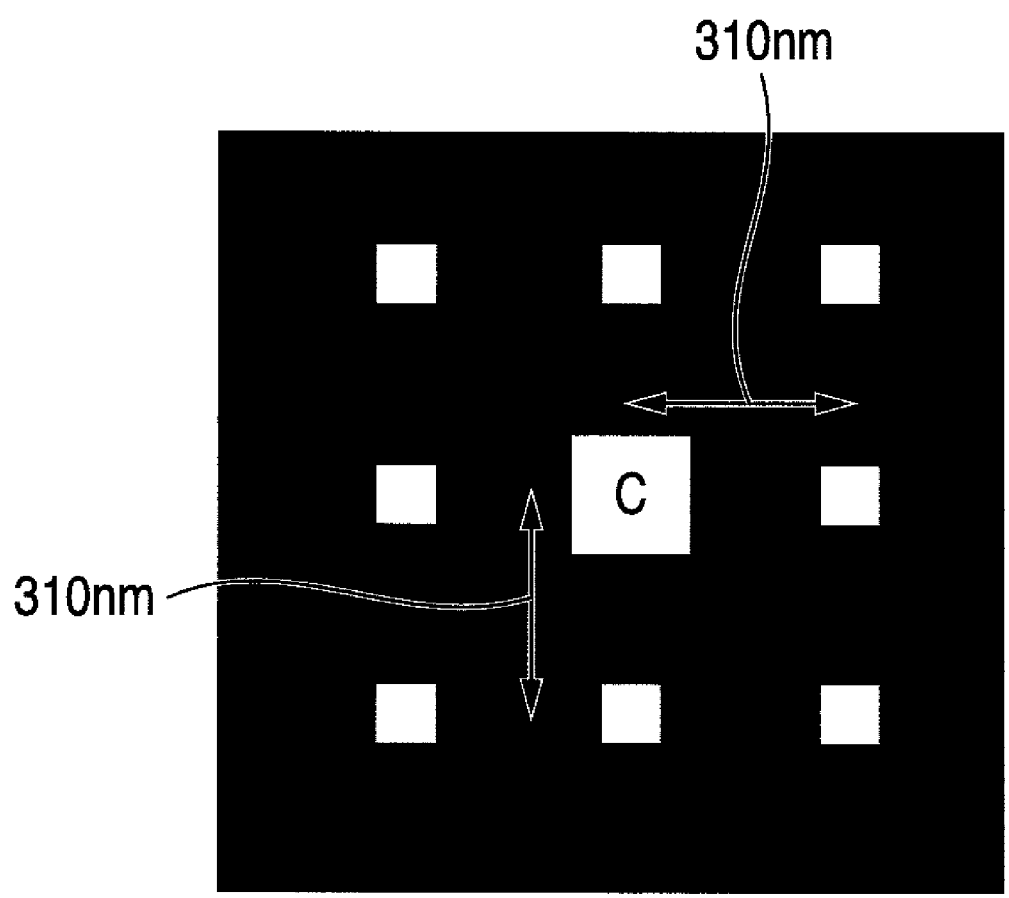
FIG. 19 is a view showing another mask data according to the first working example of the present invention.

The first mask data shown in FIG. 18 and the second mask data shown in FIG. 19 are obtained by the processes shown in FIGS. 16 and 17. When the EB drawing apparatus receives the first mask data shown in FIG. 18 and the second mask data shown in FIG. 19, it fabricates two masks. Double exposure using these two masks allows more accurate micropattern formation than in one-time exposure using the mask drawn on the basis of the pattern data shown in FIG. 11.

The size of the auxiliary pattern of each of the first mask data shown in FIG. 18 and the second mask data shown in FIG. 19 is preferably small enough not to resolve and is desirably, for example, 75% that of the main pattern (contact hole pattern) or its neighborhood. The size here means the length of one side of a pattern. An example of the size of the main pattern (contact hole pattern) is 120 nm in FIGS. 18 and 19. That is, the mask data includes a 120-nm square pattern as the main pattern. Accordingly, the size (the length of one side) of the auxiliary pattern is desirably 120 nm×75%=90 nm. According to the present invention, however, the auxiliary patterns are added to high-coherence regions. For this reason, arranging the auxiliary patterns considerably improves the resolution. From this viewpoint, the size of the auxiliary pattern is not limited to 75% that of the main pattern (contact hole pattern) or its neighborhood. Examinations made by the inventors of the present invention have revealed that a sufficient effect can be produced even when the size of the auxiliary pattern is 50% to 85% that of the main pattern (contact hole pattern). That is, even in this case, the auxiliary patterns allow the main pattern to accurately form an image on the wafer surface without being resolved.

It should be noted that the auxiliary pattern may be a rectangular pattern having sides with a length of 50% to 85% of the main pattern, the length of each side being different.

Consider pattern data having a rectangular contact hole as another example of the pattern data 41. In this case, it suffices to additionally arrange rectangular auxiliary patterns. Assume, for example, that the main pattern (contact hole pattern) has a longer side with a dimension A and a shorter side with a dimension B (<A). Preferably, the auxiliary pattern has a longer side with a dimension of A×50% to 85% and a shorter side with a dimension of B×50% to 85%.

Consider line pattern data as still another example of the pattern data 41. In this case, it suffices to additionally arrange auxiliary line patterns. Assume, for example, that the main pattern (line pattern) has a length C and a width D (<<C). Since the line pattern is resolved more readily than the contact hole pattern, the auxiliary pattern preferably has a width of D×35% to 70% and a length almost equal to C.

Preferably, the shape of the auxiliary pattern of the mask data is almost similar to that of the main pattern. For example, when the main pattern (e.g., a contact hole pattern) is a square, roughly square auxiliary patterns are preferably added to the mask data. When the main pattern (contact hole pattern) is a rectangle, rectangular auxiliary patterns are preferably added to the mask data.

Second Working Example

The normal van Cittert-Zernike theorem does not take the influence of polarization into consideration. In recent years, however, the influence of polarization is becoming non-negligible in exposing a pattern whose k1 factor is small.

In view of this, the inventors of the present invention propose a method of incorporating the polarization effect into the van Cittert-Zernike theorem. More specifically, a control unit 20 derives the van Cittert-Zernike theorem by applying the NA of a projection optical system to the σ value of an effective light source, and three-dimensionally expressing polarized light to be condensed. That is, the control unit 20 performs Fourier transformation by multiplying a function indicating an effective light source by a factor associated with polarization. Polarization factors include a factor which allows x-polarized light to remain as x-polarized, one which turns x-polarized light into y-polarized light, one which turns x-polarized light into z-polarized light, one which turns y-polarized light into x-polarized light, one which allows y-polarized light to remain as y-polarized, and one which turns y-polarized light into z-polarized light. The function obtained by multiplying the function indicating the effective light source by a polarization factor maintains the characteristics of the effective light source.

A coherent map 42, which incorporates the polarization effect, will be exemplified.

Consider a case wherein the NA of an exposure apparatus is 0.73, and the wavelength λ of exposure light is 248 nm. Assume a dipolar effective light source as shown in FIG. 20. White portions indicate light irradiated regions, and a circle, which has a radius of one and is drawn by a white line, indicates σ=1. The distance from σ=0 to the center of each pole in the abscissa direction is 0.8 when converting the distance into a σ value, and the diameter of each pole is 0.3 when converting the diameter into a σ value.

Figure 21:
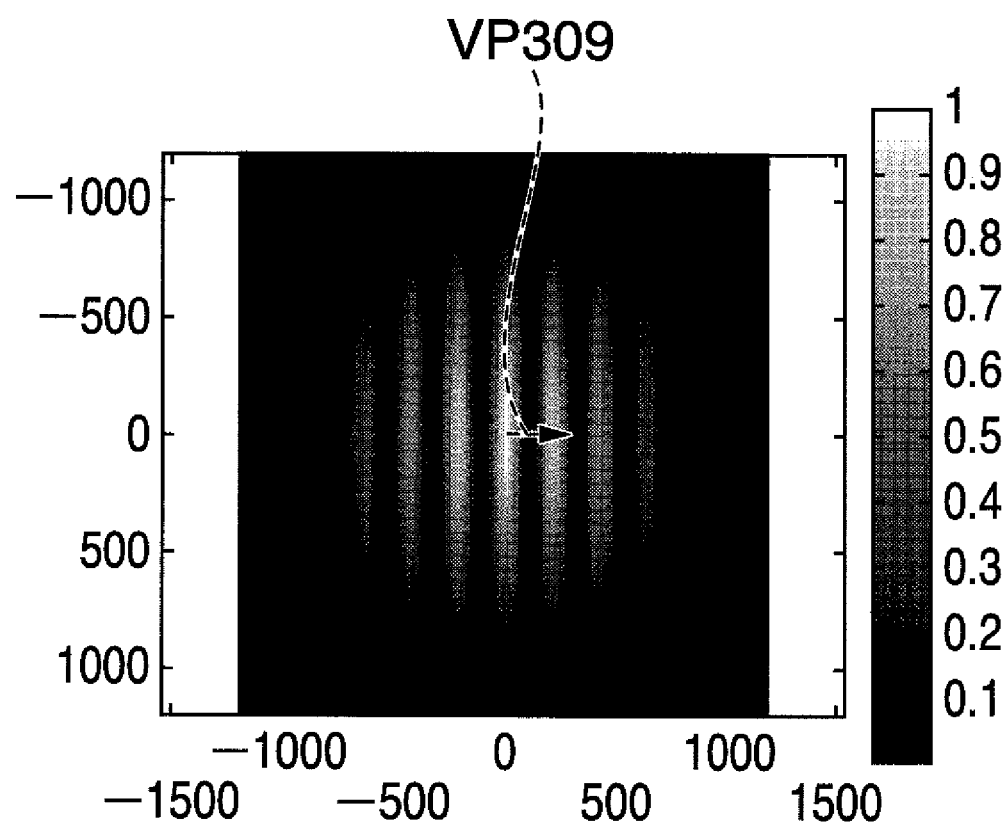
FIG. 21 is a graph showing a coherent map according to the second working example of the present invention.
Figure 22:
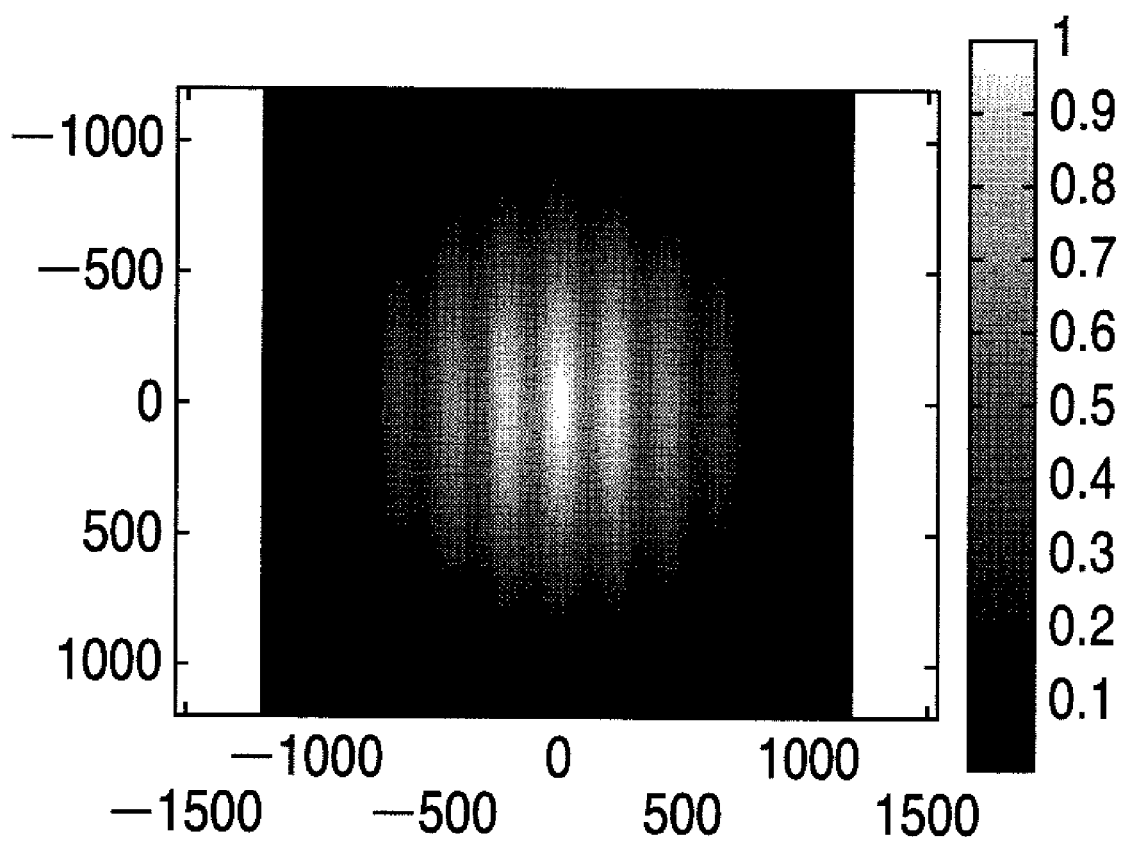
FIG. 22 is a graph showing another coherent map according to the second working example of the present invention.

For example, the control unit 20 performs Fourier transformation by multiplying a function indicating an effective light source by a y-polarized light (S-polarized light) factor to generate a coherent map 42 shown in FIG. 21. The scale of FIG. 21 is identical to that shown in FIG. 5. For example, the control unit 20 performs Fourier transformation by multiplying a function indicating an effective light source by an x-polarized light (P-polarized light) factor to generate a coherent map 42 shown in FIG. 22. The scale of FIG. 22 is identical to that shown in FIG. 21. A comparison between the coherent map 42 shown in FIG. 21 and that shown in FIG. 22 reveals that regions with high coherence can be clearly distinguished from those with low coherence with y-polarized light, but not with x-polarized light. With this phenomenon, arranging auxiliary patterns in regions with high y-polarized light allows accurate micropattern formation. On the other hand, it is ineffective to arrange auxiliary patterns for x-polarized light.

The polarization state also includes a non-polarized state (i.e., a state wherein polarization randomly changes). Deriving a coherent map 42, which takes polarization into consideration, obviously allows double exposure which takes polarization into consideration. That is, the control unit 20 generates a coherent map 42 in consideration of the polarization state of illumination light (exposure light) and specifies a reference vector indicating a forbidden pitch. For example, the control unit 20 specifies a reference vector VP309 shown in FIG. 21. The mask data group 43 for multiple exposure, which takes polarization into consideration, can be obtained by the same processes as those in steps S4 to S13 shown in FIG. 2. Even in this case, therefore, it is possible to arrange auxiliary patterns at high-coherence positions to allow accurate micropattern formation.

Figure 23:
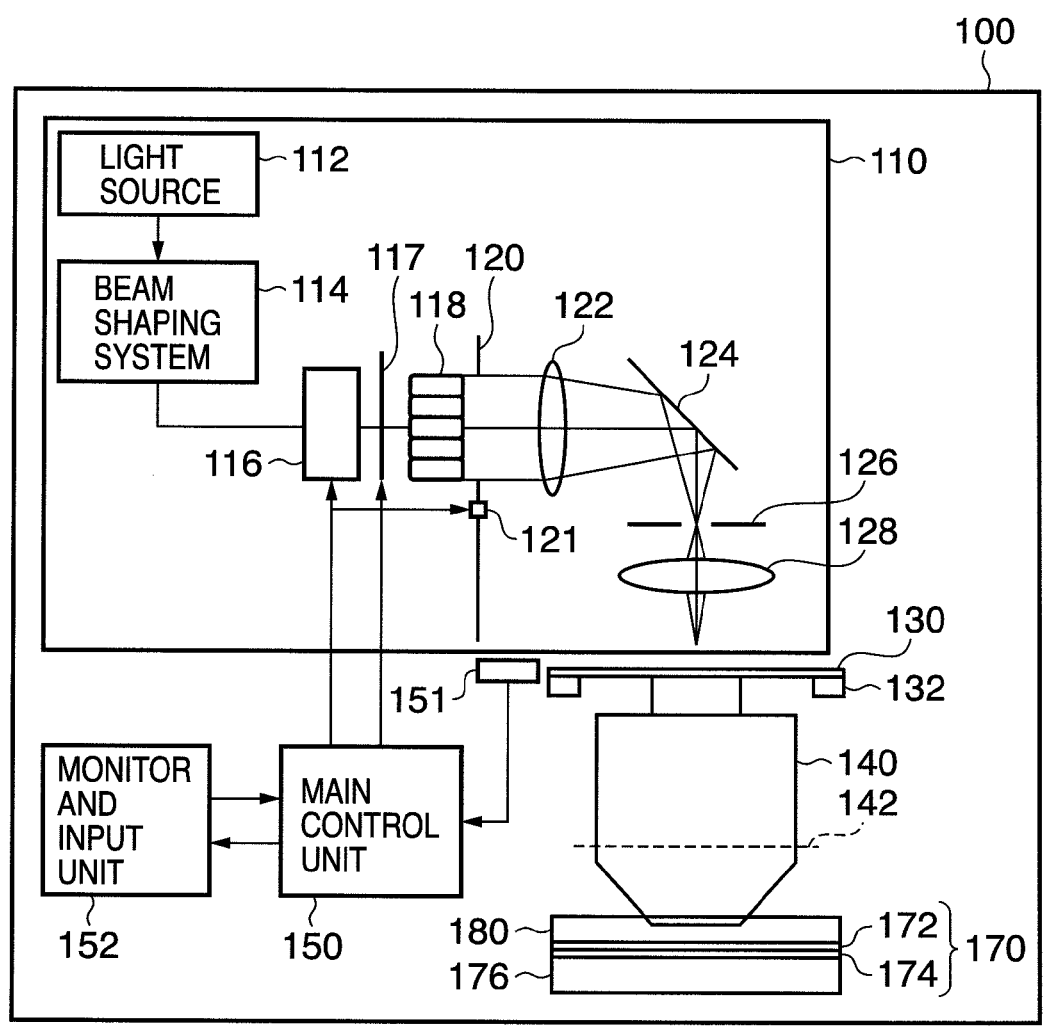
FIG. 23 is a schematic block diagram of an exposure apparatus.

An embodiment of an exposure apparatus 100, which projects a mask pattern image onto a wafer using masks 130 fabricated in the above-described embodiments, will be explained with reference to FIG. 23. FIG. 23 is a schematic block diagram of the exposure apparatus 100.

The exposure apparatus 100 comprises an illumination unit 110, a mask stage 132, a projection optical system 140, a main control unit 150, a monitor and input unit 152, and a wafer stage 176. The exposure apparatus 100 is an immersion exposure apparatus, which transfers the mask pattern onto a wafer 174 by exposure, via a liquid 180 with which the space between a substrate 170 and the final surface of the projection optical system 140 is filled. Although the exposure apparatus 100 is a step-and-scan projection exposure apparatus, it may adopt the step-and-repeat scheme or another exposure scheme.

The illumination unit 110 illuminates the mask 130, on which the circuit pattern to be transferred is formed, and comprises a light source unit and an illumination optical system. The illumination unit 110 forms the effective light source, as described in the above working examples, on the pupil plane of the projection optical system.

The light source unit includes a laser 112 serving as a light source, and a beam shaping system 114. In this embodiment, the laser 112 uses a KrF excimer laser having a wavelength of 248 nm. Alternatively, the laser 112 can adopt an ArF excimer laser having a wavelength of about 193 nm or an $F_2$ excimer laser having a wavelength of about 157 nm.

The beam shaping system 114 can use, for example, a plurality of cylindrical lenses.

The illumination optical system illuminates the mask 130. In this embodiment, the illumination optical system includes a condenser optical system 116, polarization control means 117, an optical integrator 118, an aperture stop 120, a condenser lens 122, a bending mirror 124, a masking blade 126, and an imaging lens 128. The illumination optical system can attain various illumination modes, such as off axis illumination shown in FIG. 6 or 20, in addition to the normal illumination.

The condenser optical system 116 includes a plurality of optical elements, and efficiently guides a light beam with a desired shape to the optical integrator 118.

The condenser optical system 116 includes an exposure amount adjusting unit which can change the amount of illumination light to expose the mask 130 for every illumination. The main control unit 150 controls the exposure amount adjusting unit.

The polarization control means 117 includes, for example, a polarizing element and is nearly conjugate to a pupil plane 142 of the projection optical system 140. The polarization control means 117 controls the polarization state of a predetermined region of an effective light source formed on the pupil plane 142. A polarization control means 117, including a plurality of types of polarizing elements, may be arranged on a turret, which can be rotated by an actuator (not shown), and the main control unit 150 may control operation to drive the actuator.

The optical integrator 118 is a member for making illumination light to be applied to the mask 130 uniform. In this embodiment, the optical integrator 118 uses a fly-eye lens. Alternatively, the optical integrator 118 can use, for example, an optical rod, a diffraction optical element, or a microlens array.

The aperture stop 120, having a fixed shape and diameter, is inserted immediately after the exit surface of the optical integrator 118. The aperture stop 120 is nearly conjugate to the pupil plane 142 of the projection optical system 140. The aperture shape of the aperture stop 120 corresponds to an effective light source on the pupil plane 142 of the projection optical system 140. The aperture stop 120 controls the effective light source. It should be noted that a diffractive optical element (e.g., CGH) or a prism may be arranged in the light source side of the optical integrator 118, and that the effective light source may be shaped by using the diffractive optical element or the prism in lieu of using the aperture stop.

A stop exchange mechanism (actuator) 121 can switch the aperture stop 120 to be inserted in the optical path, in accordance with the illumination condition. A driving control unit 151 controlled by the main control unit 150 controls operation to drive the actuator 121. It should be noted that the aperture stop 120 may be formed integrally with the polarization control means 117.

The condenser lens 122 condenses a plurality of light beams that have emerged from a secondary source near the exit surface of the optical integrator 118 and are transmitted through the aperture stop 120. The condenser lens 122 then guides the light beams to be reflected by the bending mirror 124, and uniformly Kohler-illuminates the surface of the masking blade 126 as the light irradiated surface.

The masking blade 126 is a field stop, which includes a plurality of movable light-shielding plates and has a rectangular aperture shape.

The imaging lens 128 projects the aperture shape of the masking blade 126 onto the surface of the mask 130.

The mask 130 has a transfer pattern and an auxiliary pattern formed, and is supported and driven by the mask stage 132. Light diffracted by the mask 130 is projected onto the wafer 174 via the projection optical system 140. The mask 130 is arranged at a position optically conjugate to the wafer 174. The mask 130 can use any one of a binary mask, a halftone mask, and a phase shift mask.

The projection optical system 140 projects the pattern formed on the mask 130 onto the wafer 174. The projection optical system 140 can use a dioptric system, including only a plurality of lens elements, or a catadioptric system including a plurality of lens elements and at least one concave mirror.

The main control unit 150 controls operation to drive each unit and especially controls illumination on the basis of information input from an input section of the monitor and input unit 152, and information (e.g., information sent from the detection unit 151) from the illumination unit 110. For example, the main control unit 150 controls operation to drive the aperture stop 120 via the driving mechanism 121. A monitor of the monitor and input unit 152 displays control information obtained by the main control unit 150 and other information. The main control unit 150 receives information of the effective light source, as described in the above working example (for example, the information of the effective light source calculated in first working example), via the monitor and input unit 152 from a user, and controls the aperture stop (alternatively, the diffractive optical element or the prism), to form the effective light source.

A photoresist 172 is applied to a wafer 174 of the substrate 170. It should be noted that the substrate 170 may be replaced with a liquid crystal substrate or another exposure target body.

A wafer stage 176 supports the wafer 174.

A material, which has a good transmittance of the exposure light wavelength, prevents dirt from adhering on the projection optical system, and well matches the resist process, is selected as the liquid 180. This embodiment uses pure water.

In exposure, a light beam emitted by the laser 112 is shaped by the beam shaping system 114, and then guided to the optical integrator 118 via the condenser optical system 116. The optical integrator 118 makes the illumination light uniform, and the aperture stop 120 sets the effective light source as shown in FIG. 6 or 20. The resultant illumination light illuminates the mask 130 under an optimal illumination condition via the condenser lens 122, bending mirror 124, masking blade 126, and imaging lens 128. The projection optical system 140 reduces and projects the light beam having passed through the mask 130 onto the wafer 174 with a predetermined magnification.

Since the substrate 170 and the final surface of the projection optical system 140 are in contact with a liquid 180 having a refractive index higher than that of air, the NA of the projection optical system 140 is relatively high, and also, the resolution is so high as to form a fine micropattern on the wafer 174. A high-contrast image is formed on the photoresist 172 under polarization control. Although this embodiment has exemplified the immersion exposure apparatus using the liquid 180, it need not always be used.

Multiple exposure in which a photoresist agent is exposed using a plurality of masks fabricated in the above-described embodiments will be explained. Multiple exposure includes a method of superimposing latent image patterns without executing a development process after each of a plurality of exposure processes and a method of executing a development process after each of a plurality of exposure processes. A representative example of the former method is double exposure, in which an illumination optical system illuminates the first mask to transfer an image of the first mask onto a photoresist by exposure via a projection optical system (first exposure). Then, the illumination optical system illuminates the second mask to transfer an image of the second mask onto the photoresist by exposure via the projection optical system (second exposure). The image of the second mask is projected and transferred by exposure onto the photoresist, on which the image of the first mask is projected and transferred by exposure and left without being developed. That is, development follows the first exposure and second exposure. In the latter method, a photoresist is developed after each of the first exposure and second exposure.

Figure 24:
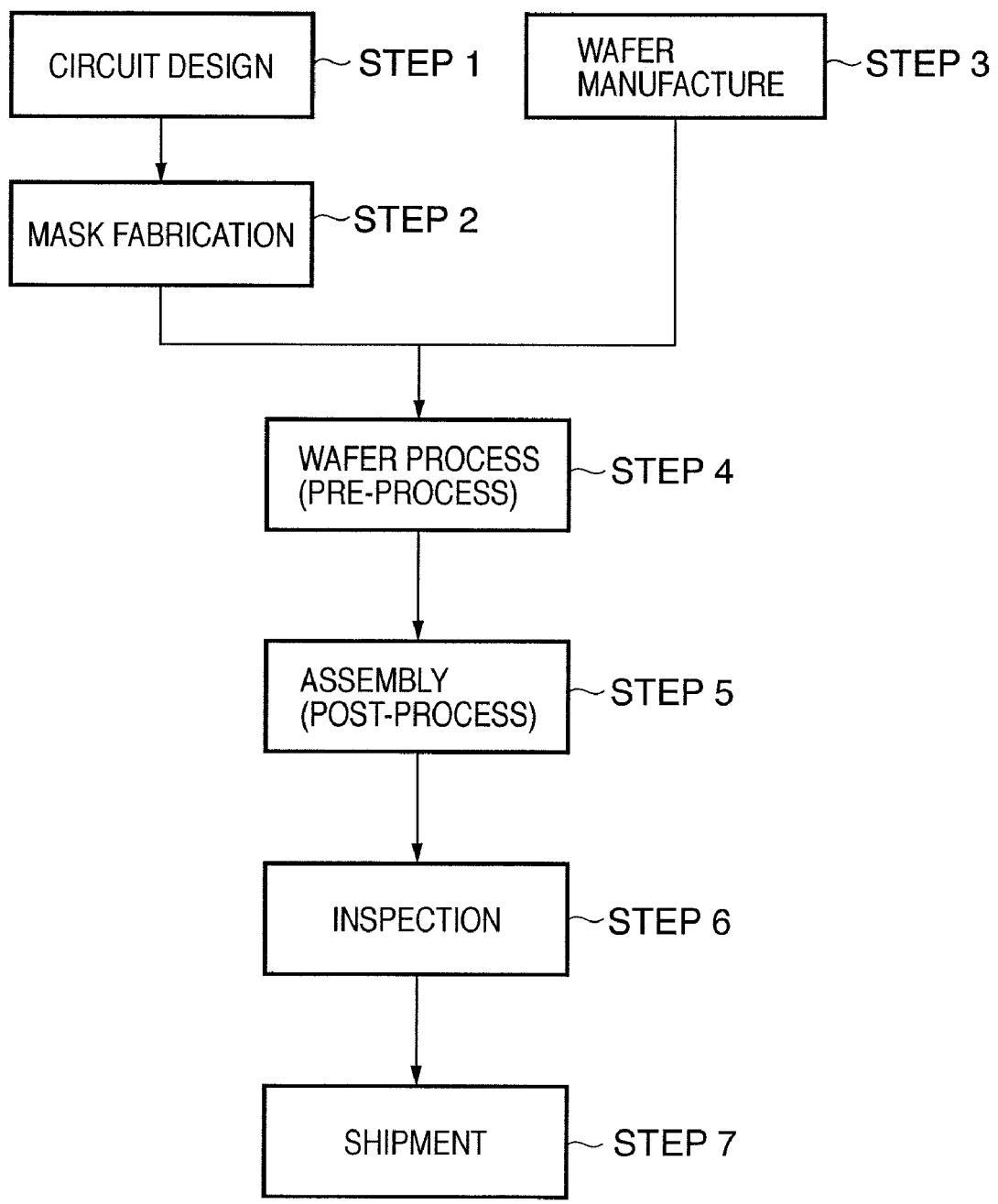
FIG. 24 is a flowchart illustrating a device manufacturing method using an exposure apparatus.

A device manufacturing method using an exposure apparatus 100, to which masks 130 fabricated in the above-described embodiments is applied, will be explained with reference to FIGS. 24 and 25. FIG. 24 is a flowchart for explaining the manufacture of a device (e.g., a semiconductor chip, such as an IC or an LSI, an LCD, or a CCD). The manufacture of a semiconductor chip will be exemplified here.

In step 1 (circuit design), the circuit of a device is designed. More specifically, a design is made at schematic levels on the basis of the functional specification and then a layout design is made. In the layout design, the above-described layout pattern is designed using CAD software to generate pattern data 41.

In step 2 (mask fabrication), a mask suitable to form the designed circuit pattern is fabricated. More specifically, mask data 43 is generated by the method or the program according to an embodiment of the present invention. An EB drawing apparatus then receives the mask data 43 and draws a pattern of, for example, Cr, corresponding to the mask data 43 on the mask 130. With this operation, the mask 130 is fabricated.

In step 3 (wafer manufacture), a wafer is manufactured using a material such as silicon. In step 4 (wafer process), called a pre-process, an actual circuit is formed on the wafer using the mask and wafer by the lithography technique according to the present invention. In step 5 (assembly), called a post-process, a semiconductor chip is formed using the wafer manufactured in step 4. This step includes an assembly step (dicing and bonding) and a packaging step (chip encapsulation). In step 6 (inspection), the semiconductor device manufactured in step 5 undergoes inspections, such as an operation confirmation test and a durability test. After these steps, the semiconductor device is completed and shipped in step 7 (shipment).

Figure 25:
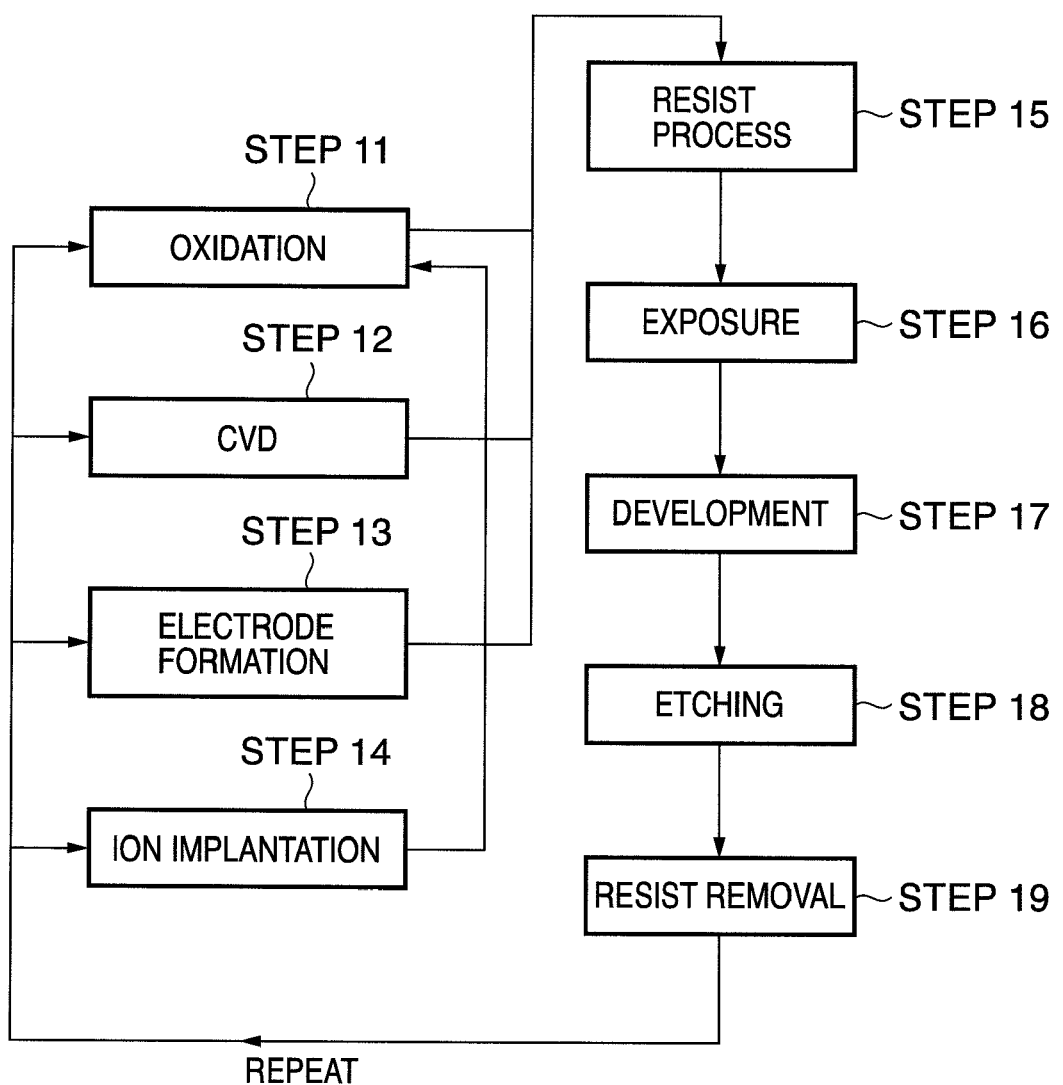
FIG. 25 is a flowchart illustrating the device manufacturing method using the exposure apparatus.

FIG. 25 is a flowchart illustrating details of the wafer process in step 4. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist process), a photoresist is applied to the wafer. In step 16 (exposure), the exposure apparatus 100 transfers the circuit pattern of the mask onto the wafer by exposure. At this time, the exposure apparatus 100 executes multiple exposure using a plurality of masks fabricated in the above-described embodiments. In step 17 (development), the exposed wafer is developed. In step 18 (etching), portions other than the developed resist image are etched. In step 19 (resist removal), any unnecessary resist remaining after etching is removed. These steps are repeated to form multiple circuit patterns on the wafer. This device manufacturing method can improve the yield in device manufacture.

A method (the latter method included in the above-described multiple exposure) of executing a development process after each of a plurality of exposure processes will be explained with reference to sectional views of steps shown in FIGS. 26 to 30.

In the step shown in FIG. 26, a target film TF is formed on a wafer W. The target film TF is a layer, such as a metal layer, in which an actual pattern is formed by exposure. A hard mask HD is applied on the target film TF.

Figure 27:
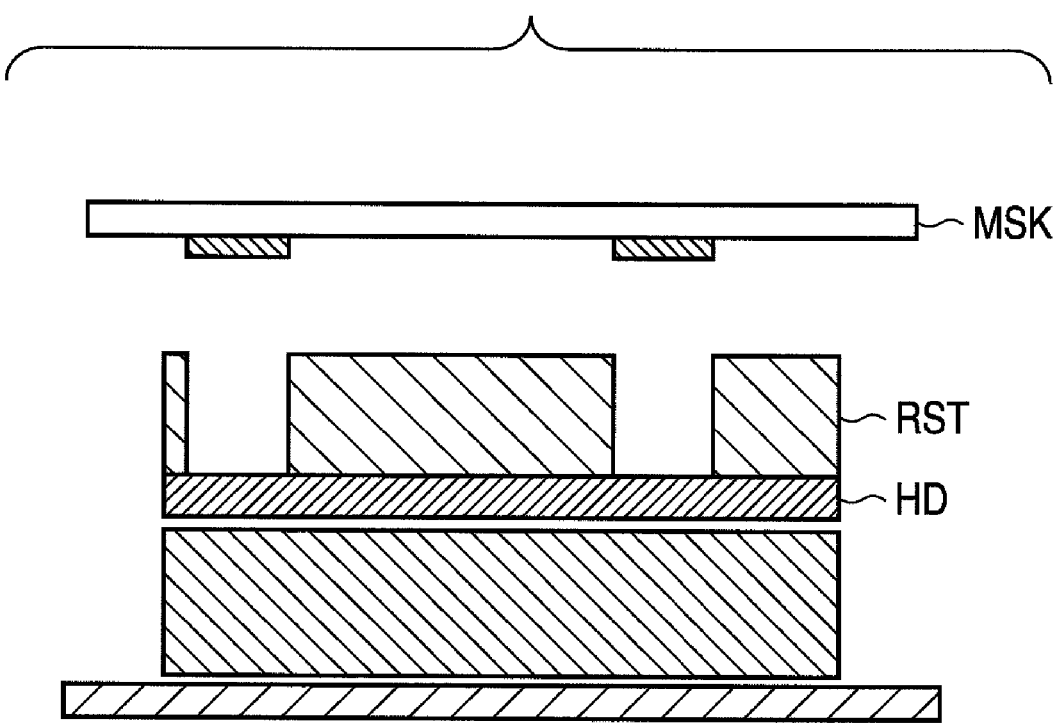
FIG. 27 is a view for explaining the method of executing a development process after each of a plurality of exposure processes.

In the step shown in FIG. 27, a resist RST is applied again on the hard mask HD and undergoes the first exposure. An exposure pattern using a mask MSK is formed on the resist RST through the development process.

Figure 28:
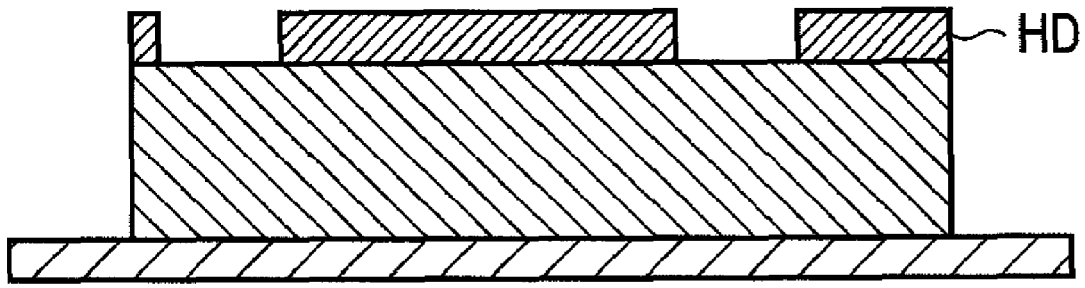
FIG. 28 is a view for explaining the method of executing a development process after each of a plurality of exposure processes.

In the step shown in FIG. 28, the hard mask HD is etched using the exposure pattern of the resist RST as a mask, and then the resist is removed. The first exposure pattern is thus formed on the hard mask HD.

Figure 29:
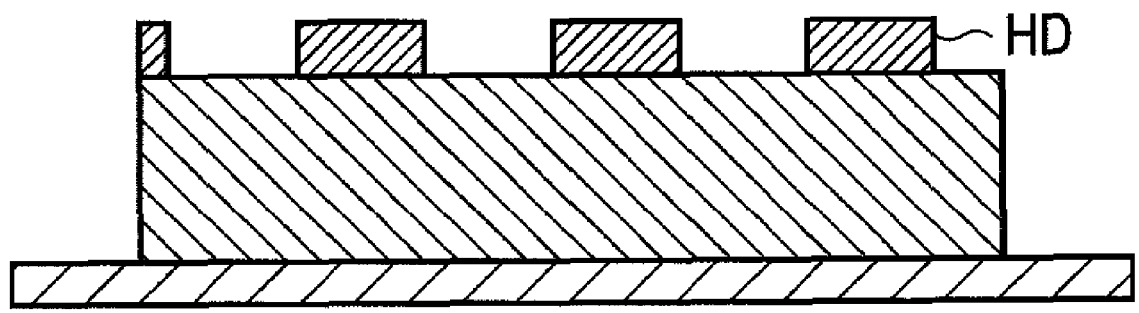
FIG. 29 is a view for explaining the method of executing a development process after each of a plurality of exposure processes.

In the step shown in FIG. 29, a resist (not shown) is applied on the hard mask HD, on which the pattern is formed by the first exposure, and undergoes the second exposure. The resist is developed to form the second exposure pattern on it. The first and second exposure patterns are formed after removing the resist and etching the hard mask HD.

Figure 30:
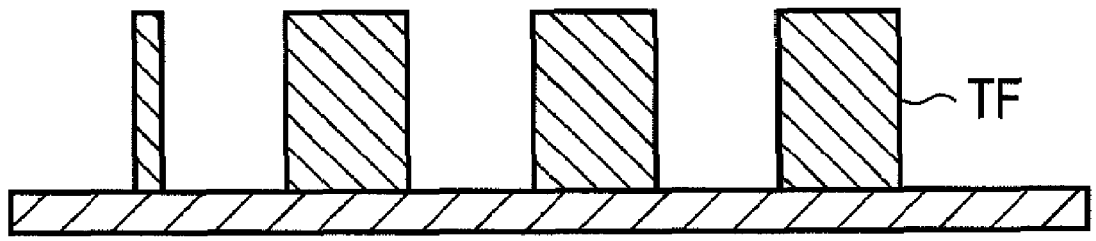
FIG. 30 is a view for explaining the method of executing a development process after each of a plurality of exposure processes.

In the step shown in FIG. 30, etching is performed again, the pattern is transferred onto the target film TF, and cleaning (the removal of the hard mask HD) is performed to allow pattern formation using double exposure.

Although the preferred embodiment and working examples of the present invention have been described above, the present invention is not limited to these embodiments and working examples, and various modifications and changes can be made without departing from the spirit and scope of the present invention. For example, although the above-described embodiment and working examples have introduced exposure methods using a binary mask, the same auxiliary pattern insertion method is also applicable to a halftone mask. The halftone mask here means a mask in which a light-shielding portion of a binary mask is made of a translucent member and an opening portion exhibits a phase difference of 180°. Note that the use of a halftone mask requires a mask pattern larger than an exposure pattern.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A computer-readable recording medium recording a mask data generation program, which causes a computer to generate data of a mask illuminated by illumination light and used to form a latent image on a photoresist via a projection optical system, the program causing the computer to execute:

a map generation step of Fourier-transforming a function indicating an effective light sources to generate a coherence map expressing a coherence distribution on an object plane of the projection optical system, on which the mask is arranged;

a specifying step of specifying a reference vector from an origin of the coherence map to a region where coherence is less than a reference value;

a first data generation step of selecting one element from a pattern including a plurality of elements, and removing, from the pattern, an element existing at a position matching a terminal point of the reference vector arranged such that the center of the selected element serves as a starting point, to generate data of a first pattern different from the pattern; and a second data generation step of generating data of a second pattern including the element removed in generating the data of the first pattern.

2. The medium according to claim 1, wherein the program further causes the computer to execute an arrangement step of matching the origin of the coherence map with the center of the element of the first pattern, and additionally arranging an auxiliary pattern in a region where the coherence is not less than a set value.

3. The medium according to claim 1, wherein, in the map generation step, Fourier transformation is performed by multiplying the function indicating the effective light source by a factor associated with polarization.

4. A mask fabrication method utilizing a mask data generation method of generating data of a mask illuminated by illumination light, and used to form a latent image on a photoresist via a projection optical system, the mask fabrication method comprising:

a map generation step of Fourier-transforming a function indicating an effective light source, to generate a coherence map expressing a coherence distribution on an object plane of the projection optical system, on which the mask is arranged;

a specifying step of specifying a reference vector from an origin of the coherence map to a region where coherence is less than a reference value;

a first data generation step of selecting one element from a pattern including a plurality of elements, and removing, from the pattern, an element existing at a position matching a terminal point of the reference vector arranged such that the center of the selected element serves as a starting point, to generate data of a first pattern different from the pattern;

a second data generation step of generating data of a second pattern including the element removed in generating the data of the first pattern;

fabricating a first mask on the basis of data of the first pattern; and fabricating a second mask on the basis of data of the second pattern.

5. An exposure method of illuminating a mask fabricated by the mask fabrication method defined in claim 4, the exposure method comprising:

a first exposure step of illuminating the first mask to project a pattern image of the first mask onto a photoresist via the projection optical system; and a second exposure step of illuminating the second mask to project a pattern image of the second mask onto the photoresist via the projection optical system.

6. An exposure method of illuminating a mask fabricated by the mask fabrication method defined in claim 4, the exposure method comprising:

a first exposure step of illuminating the first mask to project a pattern image of the first mask onto a photoresist via the projection optical system; and a second exposure step of illuminating the second mask to project a pattern image of the second mask onto another photoresist via the projection optical system.

7. A semiconductor device manufacturing method comprising exposing a photoresist by the exposure method defined in claim 5;

developing the exposed photoresist after the first exposure step and the second exposure step; and forming the pattern of the first mask and the pattern of the second mask in a layer.

8. A semiconductor device manufacturing method comprising:

exposing photoresists by the exposure method defined in claim 6;

developing the photoresist exposed in the first exposure step between the first exposure step and the second exposure step;

developing the photoresist exposed in the second exposure step after the first exposure step and the second exposure step; and forming the pattern of the first mask and the pattern of the second mask in a layer.

* * * * *